(12) United States Patent
Eu et al.

(10) Patent No.: US 9,312,491 B2
(45) Date of Patent: Apr. 12, 2016

(54) POLYMER AND PHOTOELECTRIC CONVERSION ELEMENT

(71) Applicants: JX Nippon Oil & Energy Corporation, Chiyoda-ku (JP); National University Corporation of Hiroshima University, Higashi-Hiroshima-shi (JP)

(72) Inventors: Seunghun Eu, Chiyoda-ku (JP); Tsuyoshi Asano, Chiyoda-ku (JP); Itaru Osaka, Higashi-Hiroshima (JP); Kazuo Takimiya, Higashi-Hiroshima (JP)

(73) Assignees: JX NIPPON OIL & ENERGY CORPORATION, Chiyoda-Ku, Tokyo (JP); NATIONAL UNIVERSITY CORPORATION OF HIROSHIMA UNIVERSITY, Higashi-Hiroshima-Shi, Hiroshima (JP)

(*) Notice: Subject to any disclaimer, the term of this patent is extended or adjusted under 35 U.S.C. 154(b) by 178 days.

(21) Appl. No.: 14/016,749

(22) Filed: Sep. 3, 2013

(65) Prior Publication Data
US 2014/0000716 A1 Jan. 2, 2014

Related U.S. Application Data

(63) Continuation of application No. PCT/JP2012/001391, filed on Feb. 29, 2012.

(30) Foreign Application Priority Data

Mar. 3, 2011 (JP) ................. 2011-047014

(51) Int. Cl.
*C08G 75/00* (2006.01)
*H01L 51/00* (2006.01)
(Continued)

(52) U.S. Cl.
CPC .......... *H01L 51/0036* (2013.01); *C08G 61/123* (2013.01); *C08G 61/126* (2013.01);
(Continued)

(58) Field of Classification Search
CPC ............... C08G 2261/3246; C08G 2261/95; C08G 61/126; H01L 51/0558
USPC ................................... 528/377, 380
See application file for complete search history.

(56) References Cited

U.S. PATENT DOCUMENTS

| 2010/0236631 A1 | 9/2010 | Kiselev et al. |
| 2010/0279460 A1 | 11/2010 | Yamaga et al. |
| 2011/0303293 A1 | 12/2011 | Yoshimura et al. |

FOREIGN PATENT DOCUMENTS

| CN | 101747350 A | 6/2010 |
| JP | 06-177380 A | 6/1994 |

(Continued)

OTHER PUBLICATIONS

Koganezawa et al. (Adv. Mater. 2012, 24, 425-430).*

(Continued)

*Primary Examiner* — Shane Fang
(74) *Attorney, Agent, or Firm* — Buchanan Ingersoll & Rooney PC

(57) ABSTRACT

A photoelectric conversion element has a structure where a hole transport layer, a photoelectric conversion layer, and an electron transport layer are held between a first electrode and a second electrode. The photoelectric conversion layer is a bulk heterojunction layer, and fullerene or a fullerene derivative is used as an n-type organic semiconductor. As a p-type organic semiconductor, a polymer represented by the following Expression is used. In the Expression, $R_1$, $R_2$, $R_3$, and $R_4$ each independently represent any one of a branched alkyl group, a linear alkyl group, an alkyl ester group, a carboxy alkyl group, and an alkoxy group. Independently, X is any one of S, O, and N.

5 Claims, 1 Drawing Sheet

(51) Int. Cl.
  *C08G 61/12*     (2006.01)
  *H01L 31/0256*   (2006.01)
  *H01L 51/42*     (2006.01)

(52) U.S. Cl.
  CPC ...... *H01L31/0256* (2013.01); *C08G 2261/124* (2013.01); *C08G 2261/1412* (2013.01); *C08G 2261/3223* (2013.01); *C08G 2261/3246* (2013.01); *C08G 2261/414* (2013.01); *C08G 2261/91* (2013.01); *H01L 51/0043* (2013.01); *H01L 51/4253* (2013.01)

(56) References Cited

FOREIGN PATENT DOCUMENTS

| | | |
|---|---|---|
| JP | 2006-228935 A | 8/2006 |
| JP | 2008-016505 A | 1/2008 |
| JP | 2010-037509 A | 2/2010 |
| KR | 10-0890145 B1 | 3/2009 |
| KR | 10-2010-0086197 A | 7/2011 |
| WO | 2007145482 A1 | 12/2007 |
| WO | 2008100084 A1 | 8/2008 |
| WO | 20101107101 A1 | 9/2010 |

OTHER PUBLICATIONS

Osaka et al. (Adv. Mater. 2007, 19, 4160-4165).*
Hsiang-Yu Chen, et al., "Polymer Solar Cells with Enhanced Open-Circuit Voltage and Efficiency", Nature Photonics, vol. 3, No. 11, Oct. 25, 2009, pp. 649-653.
Naraso et al., "Two Poly(2,5-thienythiazolothiazole)s: Observation of Spontaneous Ordering in Thin Films", Macromolecules, vol. 41, No. 9, Apr. 12, 2008, pp. 3169-3174.
Itaru Osaka et al., "Novel Thiophene-Thiazolothiazole Copolymers for Organic Field-Effect Transistors", Advanced Materials, vol. 19, No. 23, Oct. 30, 2007, pp. 4160-4165.
G. Padmanaban et al., "Conjugation Length Control in Soluble Poly[2-methoxy-5((2'-ethylhexyl)oxy)-1, 4-phenyenevinylene] (MEHPPV): Synthesis, Optical Properties, and Energy Transfer", Journal of the American Chemical Society, ACS Publications, vol. 122, Feb. 23, 2000, pp. 2244-2251.
S. Van Mierloo et al., "Synthesis, 1 H and 13 C NMR Assignment and Electrochemical Properties of Novel Thiophene-Thiazolothiazole Oligomers and Polymers", Magnetic Resonance in Chemistry, Mar. 18, 2010, pp. 362-369.
European Search Report dated Jul. 25, 2014 issued in corresponding European Patent Appln. No. 12751863.7 (12 pages).
International Search Report (Form PCT/ISA/210) issued on May 29, 2012 by Japanese Patent Office as the International Searching Authority for international Application No. PCT/JP2012/001391. (5 pages).
International Preliminary Report on Patentability (Form PCT/IB/373) and the Written Opinion of International Searching Authority (Form PCT/ISA/237) issued on Sep. 3, 2013, by the International Bureau of WIPO in International Application No. PCT/JP2012/001391. (5 pages).
English language translation of International Preliminary Report on Patentability (Form PCT/IB/373) and the Written Opinion of the International Searching Authority (Form PCT/ISA/237) issued on Sep. 3, 2013, in the corresponding International Application No. PCT/JP2011/001391. (6 pages).
Osaka et al., "High-Lamellar Ordering and Amorphous-Like π-Network in short-Chain Thiazolothiazole-Thiophene Copolymers Lead to High Mobilities", American Chemical Society, 2009, No. 131, pp. 2521-2529. (9 pages).
Osaka et al., "Highly Stable Semiconducting Polymers Based on Thiazolothiazole", Chemistry of Materials, 2010, vol. 22, No. 14. pp. 4191-4196. (6 pages).
Shi et al., "Synthesis of Copolymers Based on Thiazolothiazole and Their Applications in Polymer Solar Cells", J. Phys. Chem., 2010, No. 114, pp. 16843-16848. (6 pages).
Yang et al., "Synthesis and Photovoltaic Properties of Copolymers from Benzodithiophene and Thiazole", J. Phys. Chem., 2010, No. 114, pp. 17989-17994. (6 pages).
Lee et al., "Synthesis and characterization of a thiazolo[5,4-d]thiazole-based copolymer for high performance polymer solar cells", Chem. Comm., 2011, No. 47, pp. 1791-1793. (3 pages).
Peet et al., "Bulk heterojunction solar cells with thick active layers and high fill factors enabled by a bithiophene-co-thiazolothiazole push-pull copolymer", Applied Physics Letters, 2011, No. 98, pp. 043301-043301-3. (4 pages).
Blom et al., "Electric-field and temperature dependence of the hole mobility in poly (p-phenylene vinylene)", Physical Review, 1997, vol. 55, No. 2, pp. R656-R659. (4 pages).
Omote et al., "Evaluation Method of Membrane by Small Angle Glancing X-ray Diffraction", Bunseki, 2002, No. 11, pp. 623-629. (8 pages).
Inaba et al. "X-Ray Diffraction Analyses of ZnO and (Zn, Mg) O Single Crystalline Films Epitaxially Grown on a-Plane Sapphire Substrates", Journal of the Society of Materials Science, 2007, vol. 56, No. 3, pp. 223-228. (6 pages).
Notification of Reasons for Refusal issued by the Japanese Patent Office in corresponding Japanese Patent Application No. 2013-502196 on Apr. 7, 2015 (5 pages).
Chinese Office Action dated Mar. 4, 2015 issued in corresponding Chinese Patent Appln. No. 201280011555.5, with English translation (13 pages).
Office Action issued by the Chinese Patent Office in corresponding Chinese Patent Application No. 201280011555.5 on Sep. 25, 2015 (11 pages).

* cited by examiner

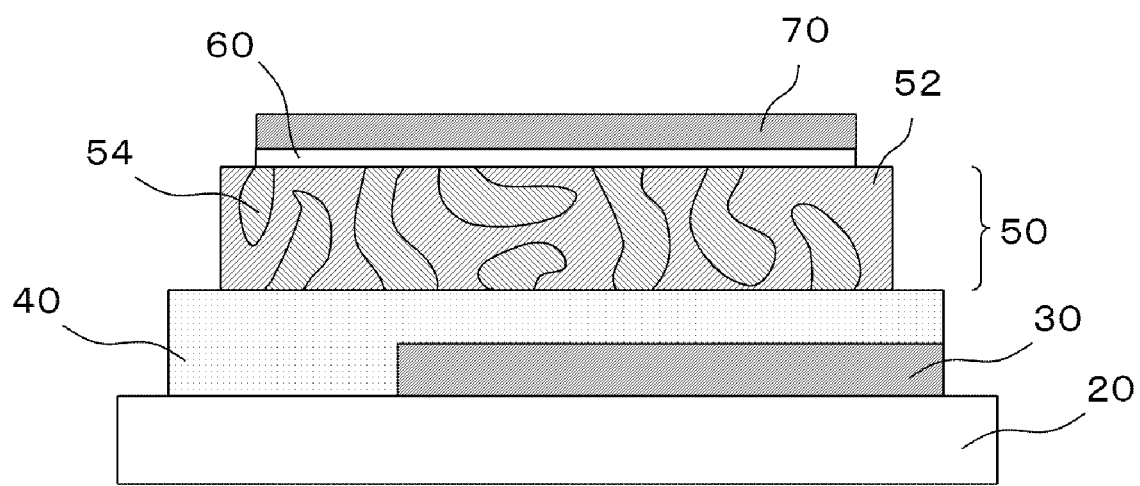

POLYMER AND PHOTOELECTRIC CONVERSION ELEMENT

TECHNICAL FIELD

The present invention relates to a polymer having high charge mobility and high solubility and to a photoelectric conversion element that converts light energy into electric energy by means of photoelectric conversion using the polymer.

BACKGROUND ART

An organic thin-film solar cell is full of flexibility and can turn into a large area as a whole and be lightweight, and thus it is expected that an organic thin-film solar cell is fabricated with ease and at low cost. Hence, organic thin-film solar cells are considered to be promising next generation solar cells. Improving the conversion efficiency to a significant level is presently an important goal to achieve the practical use of organic thin-film solar cells.

As the structure of an organic thin-film solar cell, bulk heterojunction by a mixture of a p-type semiconductor (electro donor) and an n-type semiconductor (electron acceptor, e.g., C60 derivative) is known. An advantage of the bulk heterojunction is that photoinduced charge separation occurs efficiently due to a large interface between the p-type semiconductor and the n-type semiconductor, allowing a photocurrent to be increased compared to a double-layer solar cell.

[Patent document No. 1] KR Granted Patent No. 10-0890145
[Patent document No. 2] WO 2010/107101 pamphlet
[Non-patent document No. 1] J. Am. Chem. Soc. 2009, 131, 2521
[Non-patent document No. 2] Chem. Master. 2010, 22, 4191
[Non-patent document No. 3] J. Phys. Chem. C. 2010, 114, 16843
[Non-patent document No. 4] J. Phys. Chem. C. 2010, 114, 17989
[Non-patent document No. 5] Chem. Commun. 2011, 47, 1791
[Non-patent document No. 6] Appl. Phys. Lett. 2011, 98, 043301
[Non-patent document No. 7] Phys. Rev. B. 1997, 55, R656
[Non-patent document No. 8] bunseki, 2002, 11, 623
[Non-patent document No. 9] bunseki, 2007, 56, 223

DISCLOSURE OF THE INVENTION

Problem to be Solved by the Invention

In an organic thin-film solar cell, a charge mobility (hole mobility) in a p-type semiconductor is lower compared to a charge mobility (electron mobility) in an n-type semiconductor, causing the organic thin-film solar cell to have low performance. In order to improve the hole mobility, the crystallinity of a polymer used as the p-type semiconductor is preferably increased. However, since the solubility of a polymer having high crystallinity is low in an organic solvent, it is difficult to increase an area of contact with the n-type semiconductor, and the efficiency of charge separation at a PN junction interface is thus lowered. Thus, there arises a problem that sufficient short-circuit current density (Jsc) and FF (Fill factor) cannot be obtained. Since the solubility of a polymer having high crystallinity is low in an organic solvent, it is difficult to apply an application process, causing an increase in the manufacturing costs.

In this background, a purpose of the present invention is to provide a technology capable of improving the photoelectric conversion efficiency of a photoelectric conversion element including an organic semiconductor that forms bulk heterojunction.

Means to Solve the Problem

An embodiment of the present invention is a polymer. The polymer comprises a repeating unit that includes a five-membered ring including a thiazolothiazole framework and a heteroatom, which is expressed by the following Expression (1),
wherein hole mobility measured by a SCLC method is $7.5*10^{-5}$ cm$^2$/Vs or more,
wherein solubility with respect to 1 mL of chlorobenzene is 10 mg or more,

[Formula 1]

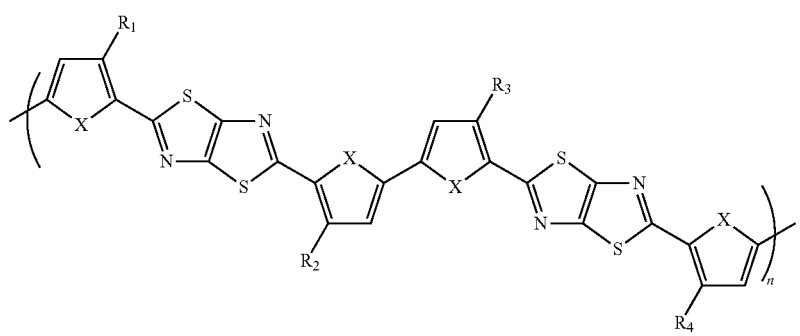

(1)

wherein, $R_1$, $R_2$, $R_3$, and $R_4$ each independently represent any one of a branched alkyl group, a linear alkyl group, an alkyl ester group, a carboxy alkyl group, and an alkoxy group, and
wherein X is independently any one of S, O, and N.

In the polymer according to the above embodiment, the percentage of linear alkyl groups in $R_1$, $R_2$, $R_3$, and $R_4$ may not exceed 50 percent, and the number average molecular weight may be 15000 or more in terms of polystyrene, in Expression (1). In Expression (1), $R_1$ and $R_2$ may be branched alkyl groups, and $R_3$ and $R_4$ may be linear alkyl groups. The polymer according to Expression (1) may be selected from among the following chemical expressions.

[Formula 2]
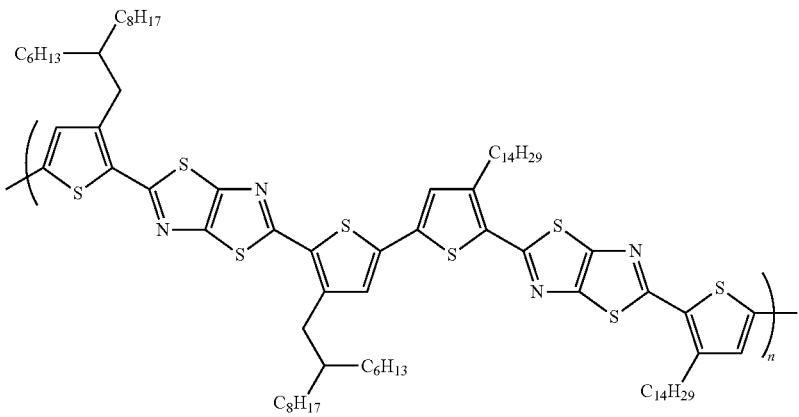
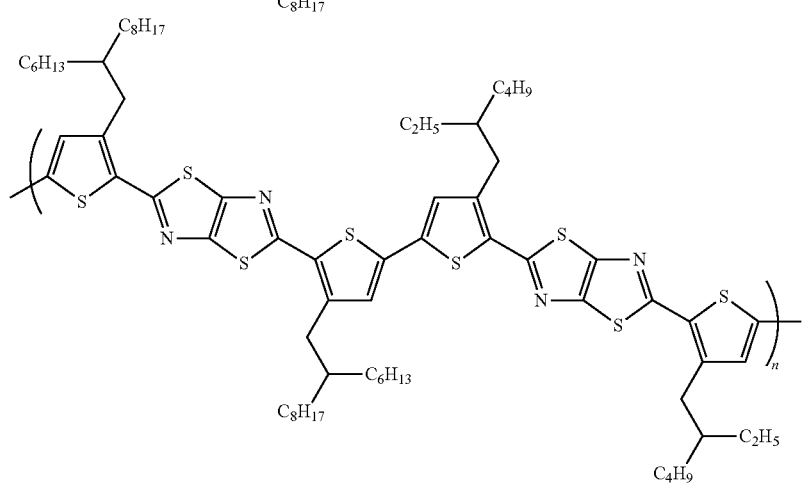
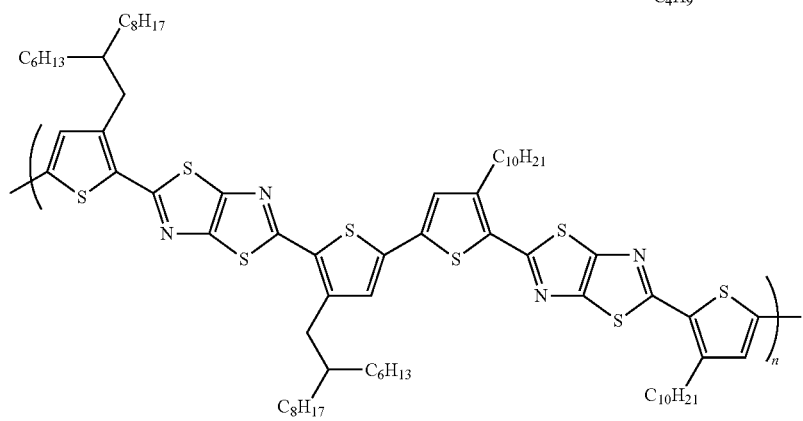
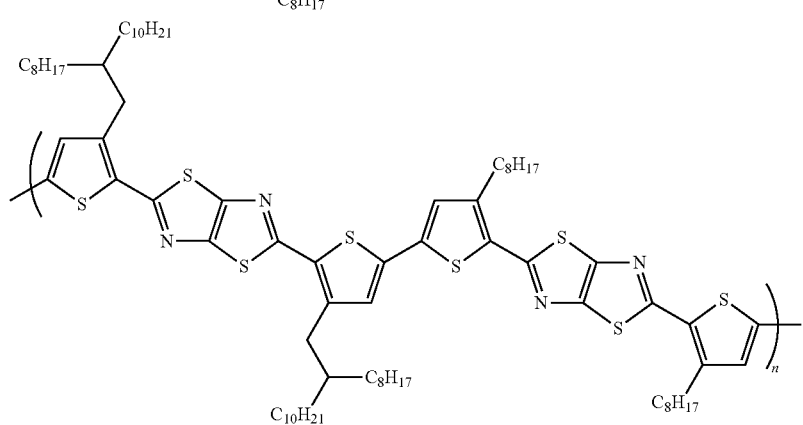

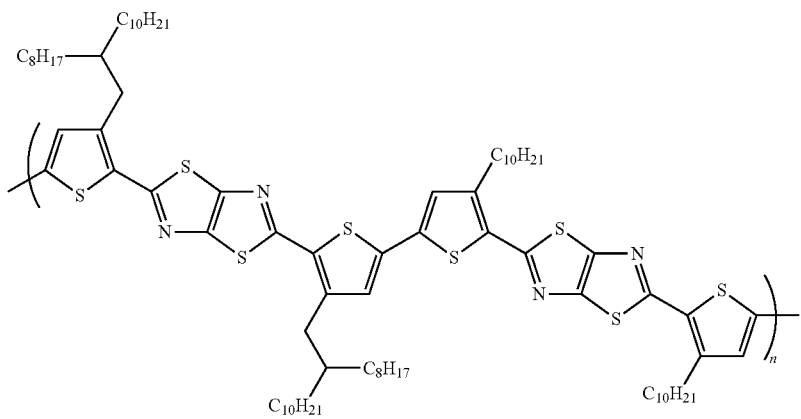
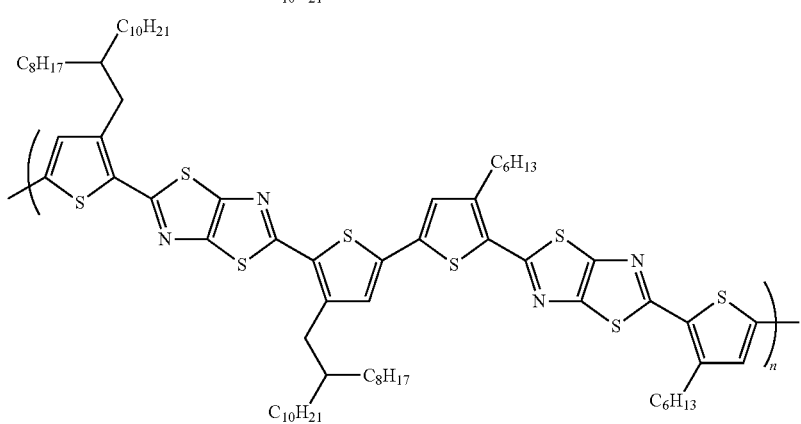
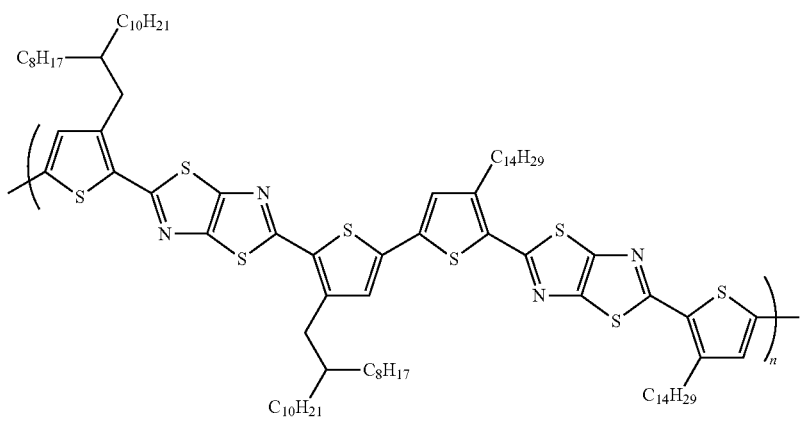
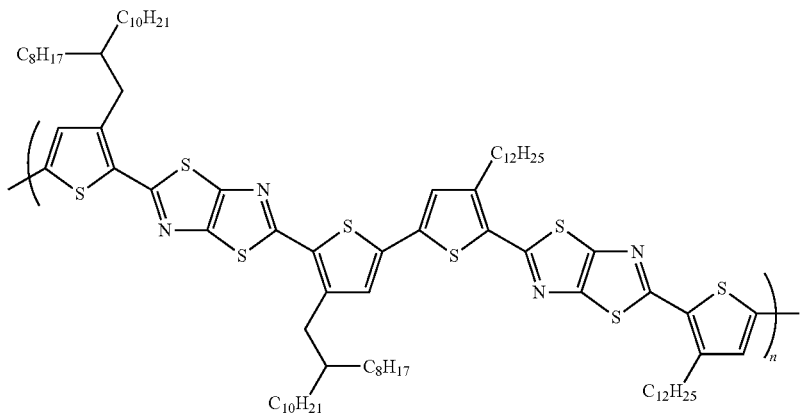

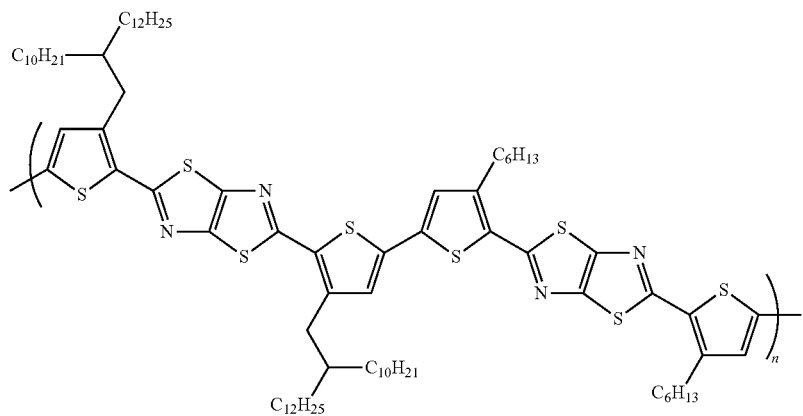
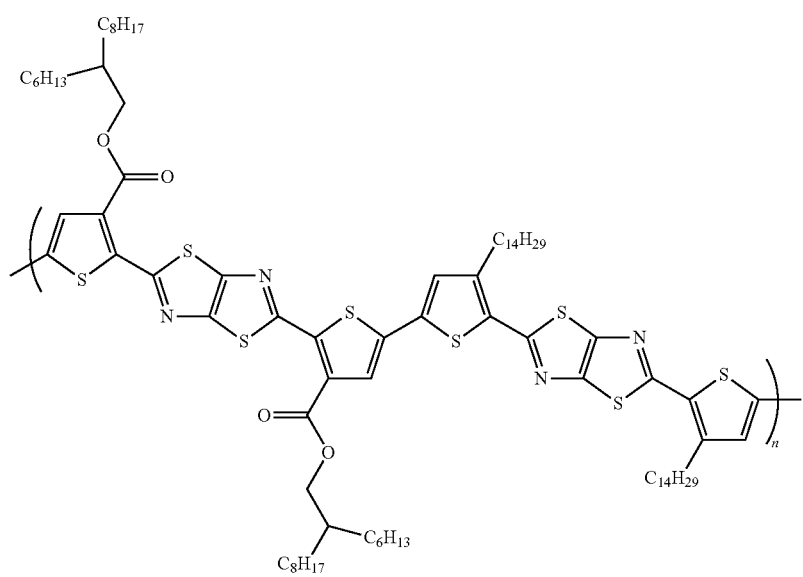
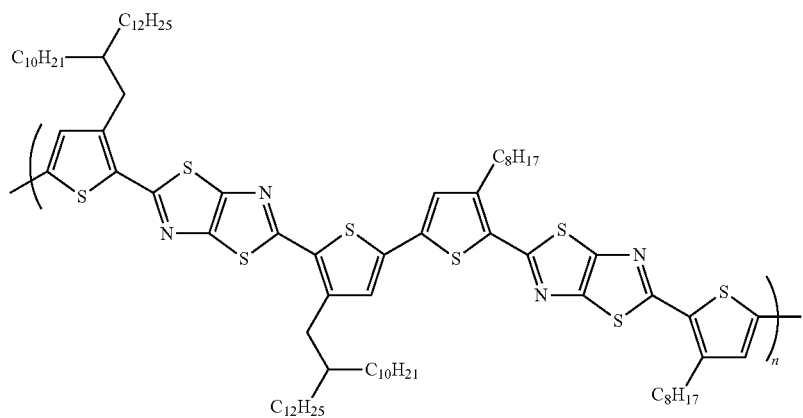

-continued
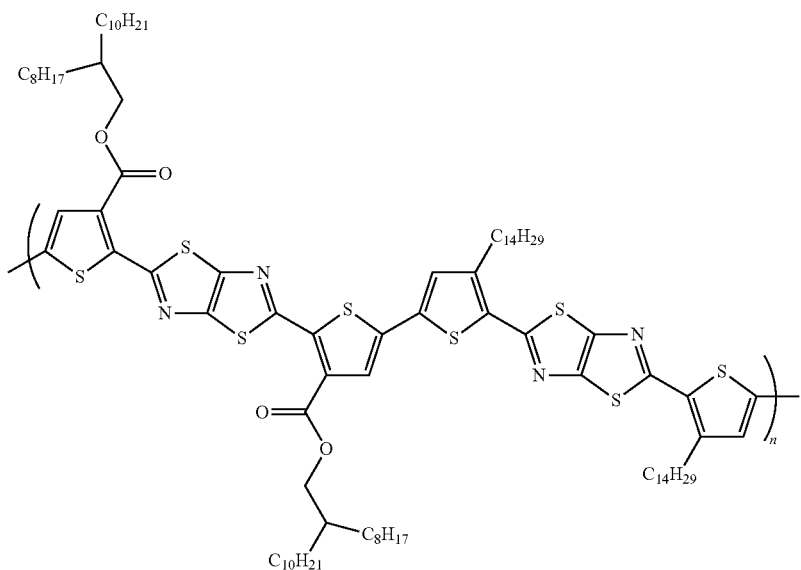
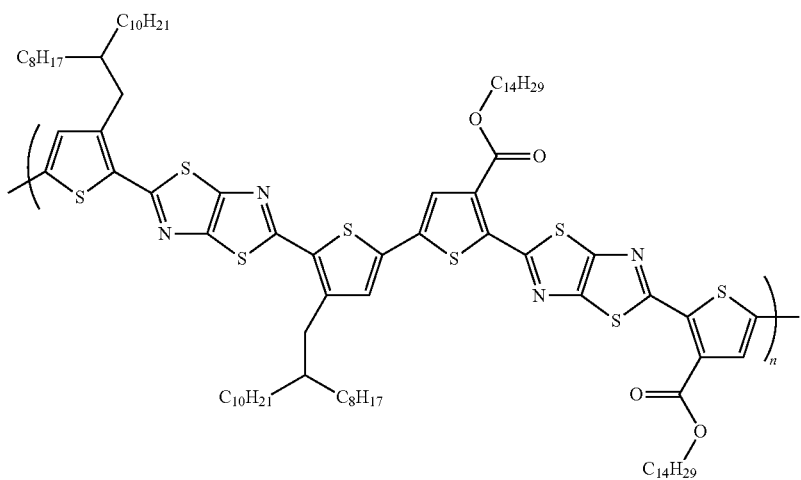
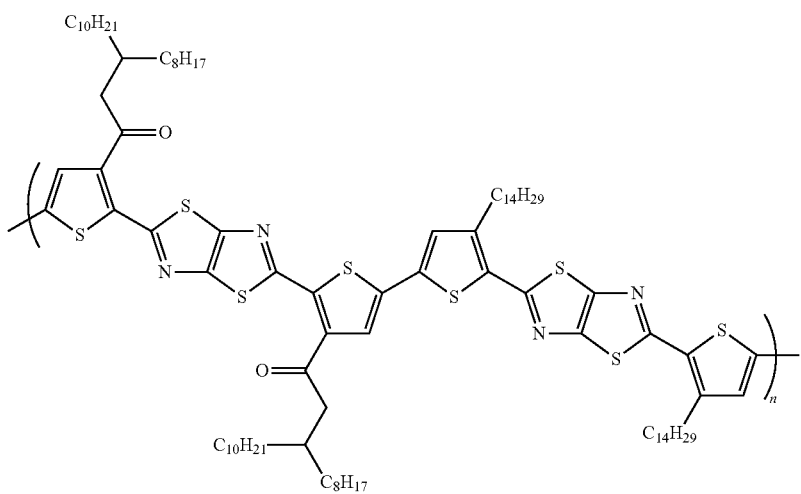

-continued
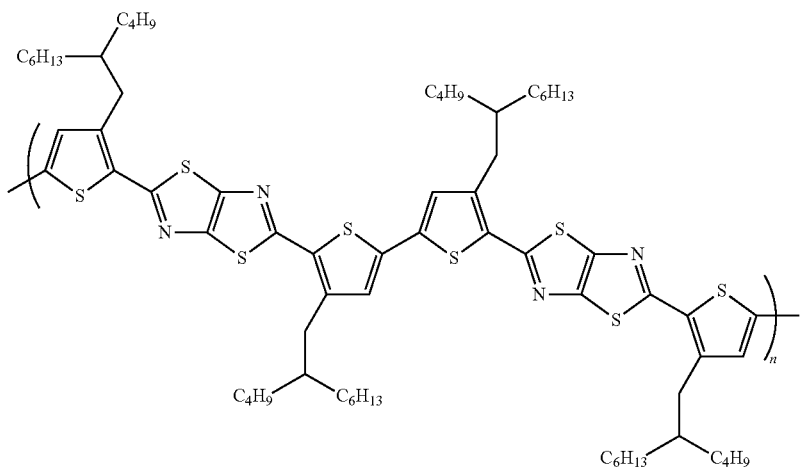
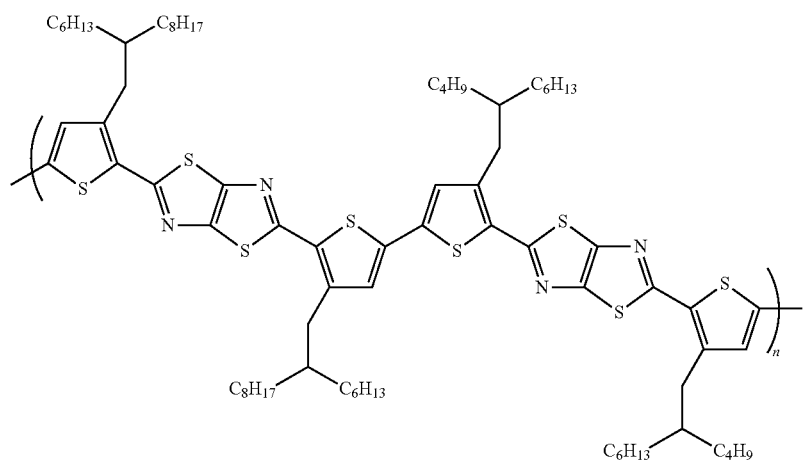
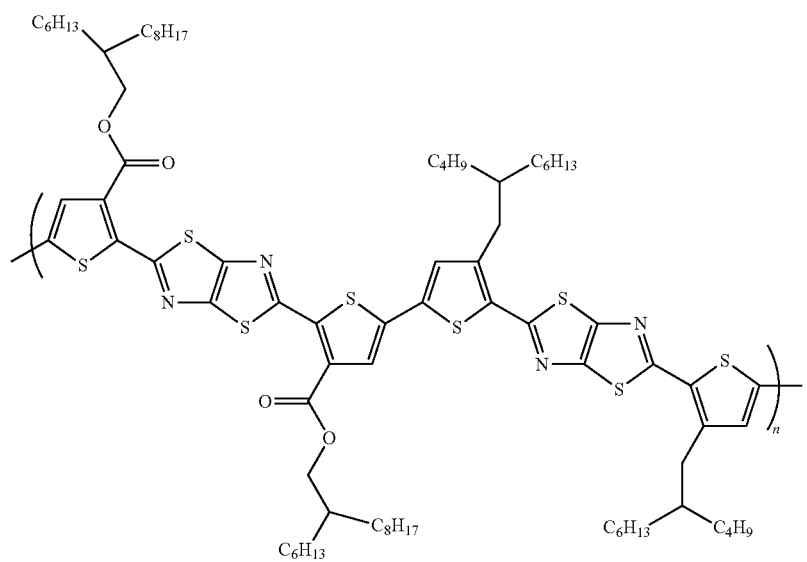

-continued

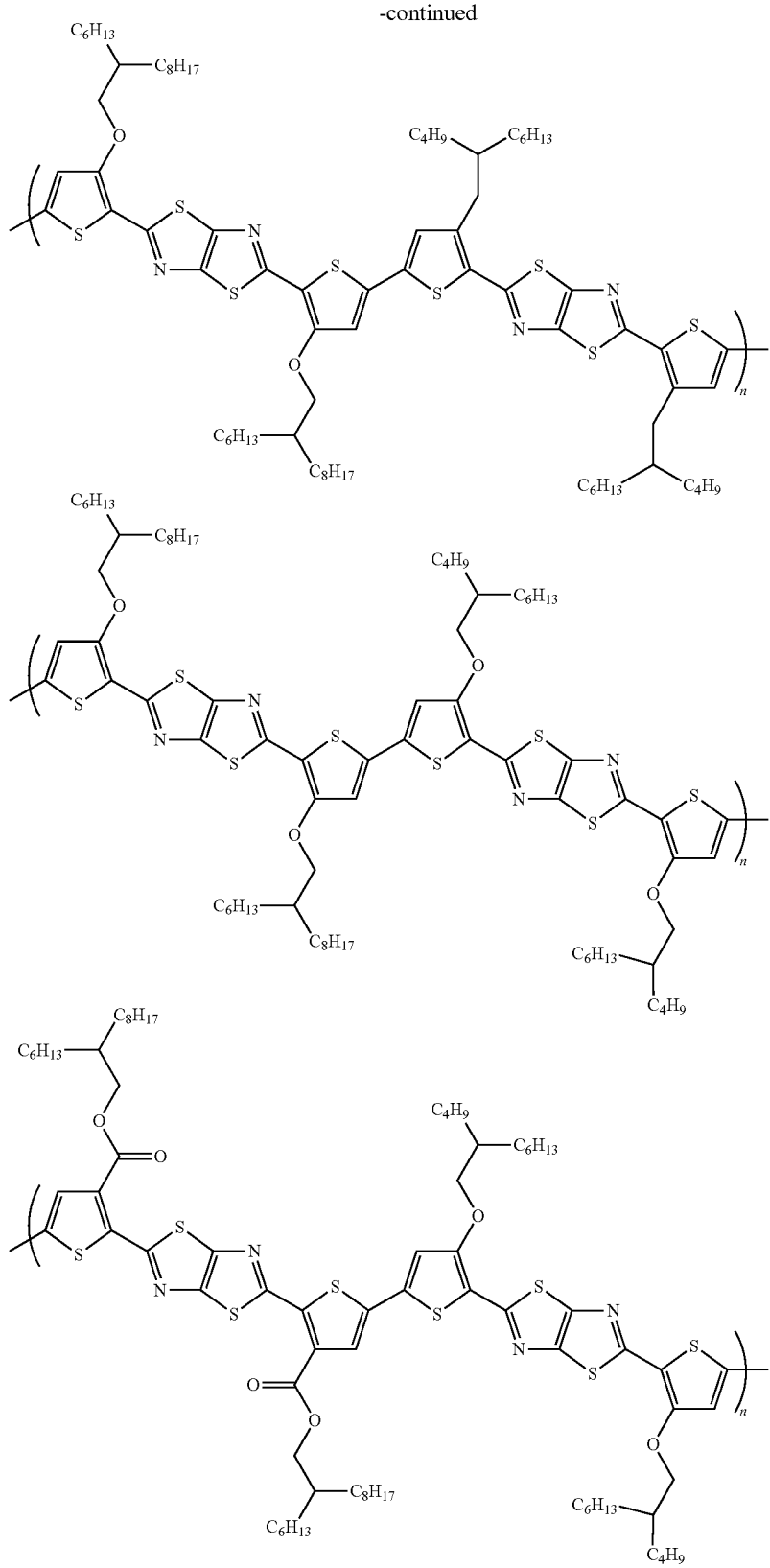

The wavelength of a light absorption terminal of the polymer may be 650 nm or more. The highest occupied molecular orbital (HOMO) of the polymer may be deeper than 5.1 eV.

An embodiment of the present invention relates to a photoelectric conversion element. The photoelectric conversion element comprises: a p-type organic semiconductor; a photoelectric conversion layer having the p-type organic semiconductor and an n-type organic semiconductor that forms bulk heterojunction; a first electrode electrically connected to the photoelectric conversion layer on a side of a light-receiving surface of the photoelectric conversion layer; and a second electrode electrically connected to the photoelectric conversion layer on a side of the photoelectric conversion layer opposite to the light-receiving side thereof, wherein the p-type organic semiconductor is the polymer according to claim 1.

According to the photoelectric conversion element according to the above embodiment, the photoelectric conversion efficiency can be improved by increasing at least either one of the short-circuit current density and the open-circuit voltage.

Combinations of the above-stated elements will also be within the scope of the present invention sought to be patented by the present patent application.

Advantage of the Invention

According to the present invention, the photoelectric conversion efficiency of a photoelectric conversion element including an organic semiconductor that forms bulk heterojunction can be improved.

BRIEF DESCRIPTION OF THE DRAWINGS

FIG. 1 is a schematic cross-sectional view illustrating a structure of a photoelectric conversion element according to an embodiment.

BEST MODE FOR CARRYING OUT THE INVENTION

Described below is an explanation of the embodiments of the present invention with reference to figures. In the figures, like numerals represent like constituting elements, and the description thereof is omitted appropriately.

Embodiment

FIG. 1 is a schematic cross-sectional view illustrating the configuration of a photoelectric conversion element 10 according to an embodiment. The photoelectric conversion element 10 according to the present embodiment is an organic thin-film solar cell having a photoelectric conversion layer including an organic semiconductor.

The photoelectric conversion element 10 is provided with a substrate 20, a first electrode 30, a hole transport layer 40, a photoelectric conversion layer 50, an electron transport layer 60, and a second electrode 70.

In the present embodiment, the first electrode 30 is a positive electrode and is electrically connected to the photoelectric conversion layer 50, which is described later. The first electrode 30 is located at a light-receiving surface side of the photoelectric conversion layer 50 and is formed of a conductive metallic oxide such as ITO (Indium Tin Oxide), $SnO_2$, FTO (Fluorine doped Tin Oxide), ZnO, AZO (Aluminum doped Zinc Oxide), and IZO (Indium doped Zinc Oxide) and a transparent conductive film such as a metallic thin film such as gold, silver, copper and aluminum. Also, the first electrode 30 is formed on top of the substrate 20 having optical transparency in order not to obstruct the light-receiving performance. For example, in addition to a colorless or colored glass, a wire glass, a glass block, or the like, a colorless or colored resin having transparency may be used as the substrate 20. More specifically, the resin may be polyester, such as polyethylene terephthalate, polyamide, polysulfone, polyethersulfone, polyether ether ketone, polyphenylene sulfide, polycarbonate, polyimide, polymethylmethacrylate, polystyrene, triacetylcellulose, polymethylpentene, and the like.

The hole transport layer 40 is provided in an area between the first electrode 30 and the photoelectric conversion layer 50. The work function of the hole transport layer 40 is in between the work function of the first electrode 30 and the work function of the photoelectric conversion layer 50. The hole transport layer 40 plays a function of facilitating the displacement of a hole from the photoelectric conversion layer 50 to the first electrode 30. The hole transport layer 40 is formed of a material having high hole mobility such as, for example, a conductive polymer, such as PEDOT (polythiophene, poly(ethylenedioxy)thiophene)/PSS (polystyrene sulfonate, poly(styrenesulfonate)), polypyrrole, polyaniline, polyfuran, polypyridine, or polycarbazole, an inorganic compound, such as $MoO_3$ or $WO_3$, an organic semiconductor molecule, such as phthalocyanine or porphyrin and their derivatives or transit metal complexes, a charge transfer agent, such as a triphenylamine compound or hydrazine compound, or a charge-transfer complex, such as tetraliafulvalene (TTF). An area may be provided in parallel in which the first electrode 30 and the photoelectric conversion layer 50 are partially and directly in contact with each other without the hole transport layer 40 in between the two.

The photoelectric conversion layer 50 according to the present embodiment is a bulk heterojunction layer and is formed such that a p-type organic semiconductor 52 having an electron-donating property and an n-type organic semiconductor 54 having an electron accepting property are mixed together on a nano-scale level. A p-type organic semiconductor according to the present embodiment is a polymer composed of a repeating unit that includes a five-membered ring including a thiazolothiazole framework and a heteroatom, which is expressed by the following formula.

[Formula 3]

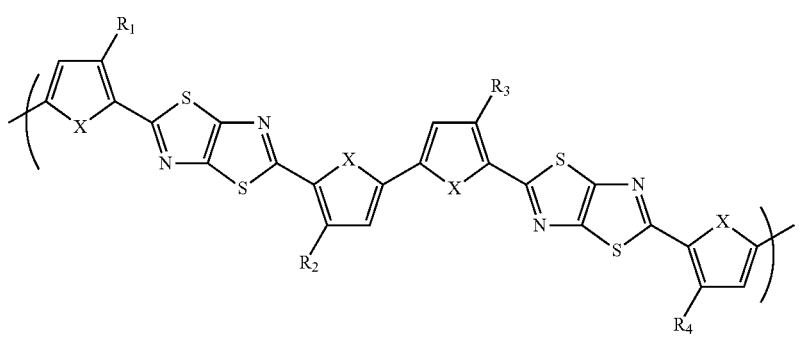

(1)

In Expression (1), $R_1$, $R_2$, $R_3$, and $R_4$ each independently represent any one of a branched alkyl group, a linear alkyl group, an alkyl ester group, a carboxy alkyl group, and an alkoxy group. In particular, the percentage of linear alkyl groups in $R_1$, $R_2$, $R_3$, and $R_4$ is preferably no more than 50 percent from the aspect of improving the photoelectric conversion efficiency. More preferably, $R_1$ and $R_2$ are branched alkyl groups, and $R_3$ and $R_4$ are linear alkyl groups. The carbon number of a branched alkyl group is 1 to 30, and examples thereof include a group represented by the following formula. Independently, X is any one of S, O, and N.

[Formula 4]

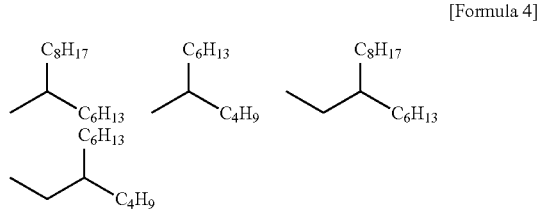

The carbon number of a linear alkyl group is 1 to 30, and examples thereof include a group represented by the following formula.

—$C_{14}H_{29}$—$C_{12}H_{25}$—$C_{10}H_{21}$—$C_8H_{17}$—$C_6H_{13}$ [Formula 5]

The respective carbon numbers of an alkyl ester group, a carboxy alkyl group, and an alkoxy group are each 1 to 30. The number average molecular weight of the above polymer is preferably 15000 or more and 500000 or less in terms of polystyrene. The polydispersity index (PDI) of the above polymer is preferably 1.5 or more. If the number average molecular weight is smaller than the above range, there is a problem that the applicability becomes too poor to obtain a uniform film. If the number average molecular weight is larger than the above range, there is a problem that the solubility in a solvent becomes too low to obtain a uniform film. By keeping the molecular weight and the polydispersity index of the polymer in the above-stated respective ranges, the solubility in an organic solvent can be increased, and the hole mobility can be improved.

The number average molecular weight is an evaluation obtained by applying a polystyrene standard sample and using gel permeation chromatography (GPC). The measurement can be taken, for example, by using Prominence GPC system (registered trademark) manufactured by Shimadzu Corporation. In the photoelectric conversion element according to the above embodiment, the hole mobility of the polymer evaluated by an SCLC (Space Charge Limited Current) method is $7.5 \times 10^{-5}$ cm2/Vs or more and is preferably $1.0 \times 10^{-4}$ cm2/Vs or more. The hole mobility by the SCLC method is a value obtained as described in the following. A film was produced by the spin coating of commercially available PEDOT:PSS (product name: Starck AI 4083) on an ITO transparent electrode. The film was then heated and dried at 120 to 150° C. so as to form a PEDOT:PSS film having a thickness of about 40 nm. A coating liquid was prepared by adding a predetermined amount of the polymer in a chlorobenzene solvent, and the coating liquid was spin-coated on the PEDOT:PSS film. After this, the coating liquid was dried at a predetermined temperature so as to form a polymer layer having a thickness of about 130 nm. Au was deposited on the obtained polymer layer by a vacuum deposition method so that the film thickness became 100 nm. The deposition speed was adjusted so as not to exceed 0.1 nm per second. An element that was prepared (ITO transparent electrode/PEDOT:PSS film/photoelectric conversion layer/Au) was placed in a dark box, and the current (J)-voltage (V) characteristics were measured. The obtained current-voltage characteristics were log-log plotted such that $J^{1/2}$ and V were shown in the vertical axis and the horizontal axis, respectively, and were then fitted in an SCLC region so as to calculate a slope (a). In a $(J)^{1/2} = [9 \in 0 \in r\mu/8(L^3)]^{1/2} V$ equation, what was represented by $[9 \in 0 \in r\mu/8(L^3)]^{1/2}$ was equal to the slope obtained from the graph. Thus, it is defined that $a = [9 \in 0 \in r\mu/8(L^3)]^{1/2}$. By solving this for $\mu$, $\mu = [8(L^3)(a^2)]/[9 \in 0 \in r]$ was obtained, and a calculation was made after substituting $\in 0$ and $\in r$ in this equation. In the equation, $\mu$ represents the mobility of the polymer, L represents the film thickness of the polymer, $\in 0$ represents the dielectric constant for vacuum, and $\in r$ represents the dielectric constant of the polymer. See non-patent document No. 7 for reference.

The above polymer has the property of having high solubility to a solvent. For example, the solubility of the polymer is 10 mg or more with respect to 1 mL chlorobenzene and is more preferably 12 mg or more. The solubility is a value obtained as described in the following. The value represents a weight at which no precipitation is visually produced after adding a predetermined amount of the polymer and 1 mL of chlorobenzene in a sample bottle with a lid under a nitrogen atmosphere and then leaving the mixture for 10 minutes at 25 to 30° C. after stirring for two hours at 85° C.

The light absorption terminal wavelength of the polymer is preferably 650 nm or more. With this, the utilization rate of sunlight can be improved, and the conversion efficiency can thus be improved. High short-circuit current density (Jsc) can be obtained by high hole mobility and by lengthening the light absorption terminal wavelength. The light absorption terminal wavelength is a value obtained as described in the following. Under a nitrogen atmosphere, a coating liquid was prepared by adding a predetermined amount of the polymer in a chlorobenzene solvent of 1 ml, and the coating liquid was spin-coated on the substrate. After this, the coating liquid was dried at a predetermined temperature so as to form a layer having a thickness of about 120 nm. The absorption spectrum of the obtained film including the substrate was obtained. Then, the absorption spectrum of only the substrate was obtained. The absorption spectrum of only the polymer film was obtained by subtracting the spectrum of only the substrate from the spectrum of the film including the substrate. The light absorption terminal was obtained from the obtained absorption spectrum. As the substrate, a glass substrate or the like can be used. The measurement can be taken, for example, by a spectrophotometer (UV-Vis) U-4100 (registered trademark) by Hitachi High-Technologies Corporation.

The level of the highest occupied molecular orbital (HOMO) when the vacuum level of the polymer is set to 0 eV is preferably deeper than 5.1 eV. With this, a high open-circuit voltage (Voc) can be obtained. The HOMO level is a value measured using an atmospheric photoelectron spectroscopy AC-3 (registered trademark) by RIKEN KEIKI Co., Ltd. A sample for HOMO level evaluation was prepared by a method similar to that for a sample used for the measurement of the light absorption terminal wavelength.

The n-type organic semiconductor used herein is an electron-accepting molecule or a polymer thereof. Such an electron-accepting molecule is, for instance, fullerene, a fullerene derivative, such as phenyl-C61-butyric acid methyl ester ([60] PCBM), bis[60] PCBM, mono-indene C60 (ICMA), bis-indene C60 (ICBA), or phenyl-C71-butyric acid methyl ester ([70] PCBM), a carbon material, such as a carbon nanotube or a chemically-modified carbon nanotube, or a perylene derivative.

The electron transport layer 60 is provided in an area between the second electrode 70 and the photoelectric conversion layer 50. The work function of the electron transport layer 60 is in between the work function of the second electrode 70 and the work function of the photoelectric conversion layer 50. The electron transport layer 60 plays a function of facilitating the displacement of an electron from the photoelectric conversion layer 50 to the second electrode 70. Also, as the electron transport layer 60, various types of organic and inorganic materials can be formed in order that the adhesion, between the photoelectric conversion layer and the counter electrode metallic layer, and an exciton-blocking property can be improved. The material used herein is not particularly limited insofar as the material conforms to a purpose of the present invention. For example, a thin-film layer can be used that is formed of an organic matter such as an organic semiconductor molecule (e.g., phenanthroline, bathocuproine, or perylene), a derivative thereof, or a transit metal complex, of an inorganic compound (e.g., LiF, CsF, CsO, $Cs_2CO_3$, TiOx (x is an arbitrary number from 0 to 2), or ZnO), or of a metal such as Ca or Ba.

The second electrode 70 of the present embodiment is a negative electrode and is electrically connected to the photoelectric conversion layer 50 on a side of the photoelectric conversion layer 50 opposite to the light-receiving side thereof. The material used for the second electrode 70 is not particularly limited as long as the material is electrically conductive. For instance, a metal, such as gold, platinum, silver, copper, aluminum, magnesium, lithium, or potassium, or a carbon electrode can be used. Regarding a method for installing the counter electrode, a known method may be used for deposition, such as a vacuum evaporation method, an electron beam vacuum evaporation method, a sputtering method, a method whereby metal fine particles dispersed in a solvent are applied and then the solvent is volatilized and removed.

In the photoelectric conversion element 10 according to the present embodiment, the position of the hole transport layer 40 and the position of the electron transport layer 60 can be reversed. If the electron transport layer 60 is provided in an area between the first electrode 30 and the photoelectric conversion layer 50 and the hole transport layer 40 is provided in an area between the second electrode 70 and the photoelectric conversion layer 50, the first electrode 30 serves as a negative electrode, and the second electrode 70 serves as a positive electrode.

According to the photoelectric conversion element 10 according to the present embodiment, the photoelectric conversion efficiency can be improved by increasing at least either one of the short-circuit current density and the open-circuit voltage.

In particular, if $R_1$ and $R_2$ shown in Expression (1) are set to be branched alkyl groups, and $R_3$ and $R_4$ are set to be linear alkyl groups (hereinafter, referred to as a polymer a), even more improvement in the photoelectric conversion efficiency can be expected.

Further, if all $R_1$, $R_2$, $R_3$, and $R_4$ are set to be branched alkyl groups (hereinafter, referred to as a polymer b), remarkable photoelectric conversion efficiency can also be obtained. In this case, however, the respective lengths of the branched alkyl groups need to be properly adjusted. There is a problem that the mobility goes down, dropping the photoelectric conversion efficiency, when the lengths of the alkyl groups are too long. On the other hand, there is a problem that the solubility goes down, dropping the photoelectric conversion efficiency, when the lengths of the branched alkyl groups are too short. The respective appropriate carbon numbers of the branched alkyl groups are preferably 1 to 18 and more preferably 5 to 13. Examples of the alkyl groups include a group represented by the following formula.

[Formula 6]

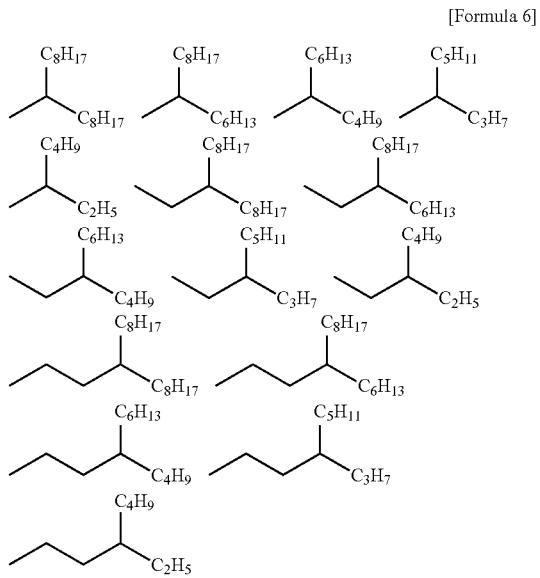

If two or more of $R_1$, $R_2$, $R_3$, and $R_4$ shown in Expression (1) are set to be alkyl ester groups, carboxy alkyl groups, or alkoxy groups (hereinafter, referred to as a polymer c), remarkable photoelectric conversion efficiency can also be obtained. In particular, if alkoxy groups are introduced, the wavelength of the light absorption terminal of the polymer can be lengthened compared to alkyl groups. The alkyl substituents used in this case may be either linear or branched. Linear alkyl substituents having a carbon number of 1 to 30, preferably 5 to 25, and more preferably 10 to 20 can be used. Alternately, branched alkyl substituents having a carbon number of 1 to 30, preferably 5 to 25, and more preferably 8 to 20 can be used. Examples of the alkyl ester groups, the carboxy alkyl groups, and the alkoxy groups include a group represented by the following formula.

[Formula 7]

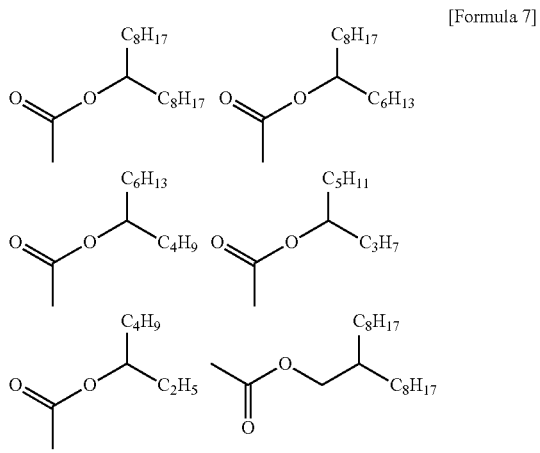

-continued

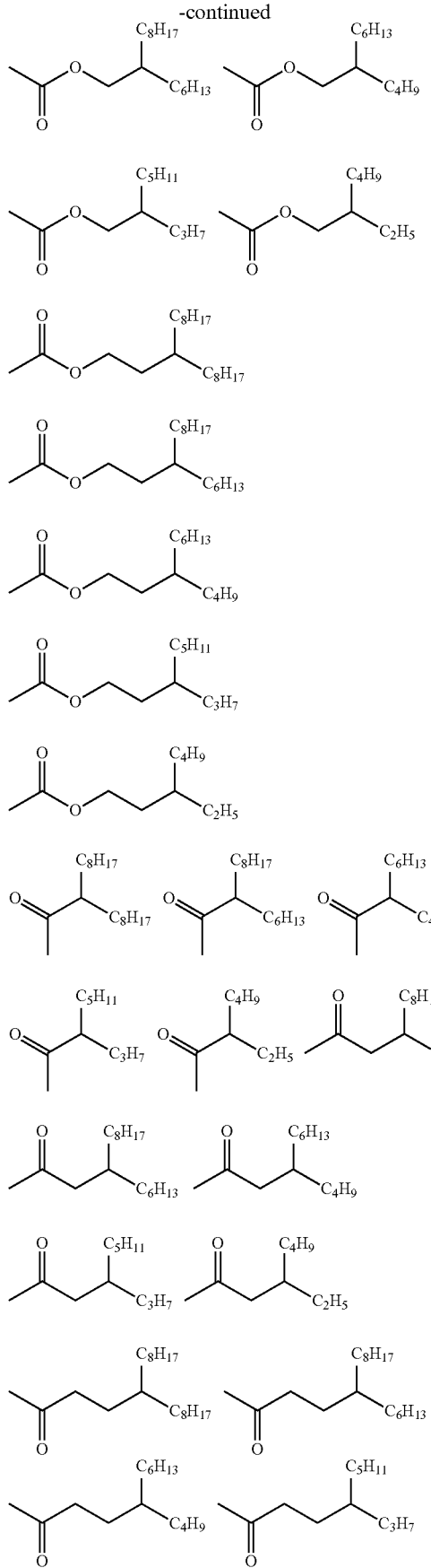

-continued

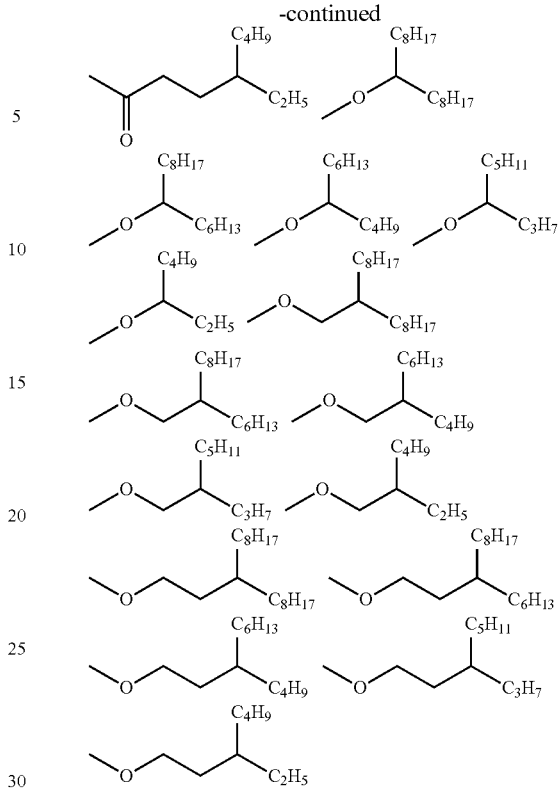

In in-plane x-ray diffraction measurement using a mixed thin film of a p-type organic semiconductor and an n-type organic semiconductor, it is desired that either of the following conditions be satisfied: the ratio (I2/I1) between peak top strength (I1) in a range of 2θ of 2 to 4 degrees and peak top strength (I2) in a range of 2θ of 23 to 26 degrees is 0.2 or below; or the ratio (I2/I3) between peak top strength (I3) in a range of 2θ of 15 to 23 degrees and the peak top strength (I2) is 0.6 or below. Either one of the conditions, I2/I1 and I2/I3, needs to be satisfied. A sample used for the in-plane x-ray diffraction measurement was prepared by the drop casting of a mixed solution that was the same as the one used for the element for the organic thin-film solar cell. The film thickness is 500 nm or more. This is to increase the diffraction intensity. The measurement can be taken, for example, by using a fully-automated multipurpose horizontal X-ray diffractometer SmartLab (registered trademark) manufactured by Rigaku Corporation. See non-patent documents No. 8 and No. 9 for reference.

The polymer used as the p-type organic semiconductor according to the present embodiment has the property of having high hole mobility. In addition, the polymer has the property of having excellent solubility to an organic solvent since the crystallinity thereof is low. Therefore, a photoelectric conversion layer can be formed by a non-vacuum process such as spin coating or slot die coating, thus allowing for the simplification of manufacturing equipment and, further, the reduction in manufacturing cost.

By selecting the respective lengths of the alkyl chains used for $R_1$, $R_2$, $R_3$, and $R_4$ of the polymer shown in Expression (1), the adjustment of the HOMO level of the polymer is possible. By shortening the alkyl chains, a deeper HOMO level can be achieved. With this, the atmospheric stability of the photoelectric conversion layer can be improved, and the lifetime of photoelectric conversion element can be increased.

Exemplary Embodiments

Detailed description will be made below regarding the present invention with reference to examples. However, the present invention is by no means intended to be restricted to such examples.

Photoelectric conversion elements according to exemplary embodiments 1 through 8 and comparative examples 1 through 4 share a common element structure except for the form of a photoelectric conversion layer, and the outline thereof is as shown in the following.

[Element Structure] ITO transparent electrode/PEDOT:PSS film/photoelectric conversion layer/Ca/Al A commercially available ITO glass (surface resistance 20 Ω/sq or below) was used as an ITO transparent electrode. A film was produced by the spin coating of commercially available PEDOT:PSS (product name: Starck AI 4083) on the ITO transparent electrode. The film was then heated and dried at 120 to 150° C. so as to form a PEDOT:PSS film having a thickness of about 40 nm. A coating liquid of a predetermined concentration was prepared by adding [60] PCBM and a p-type organic semiconductor in a chlorobenzene solvent in a 1:1 weight ratio, and the coating liquid was spin-coated on the PEDOT:PSS film. After this, the coating liquid was dried at a predetermined temperature so as to form a photoelectric conversion layer having a thickness of about 120 nm. Details of a polymer serving as the p-type organic semiconductor will be described later. Ca was deposited on the obtained photoelectric conversion layer by a vacuum deposition method so that the film thickness became about 10 nm. Al was further deposited by a vacuum deposition method so that the film thickness became 100 nm.

(Polymer Serving as P-Type Organic Semiconductor)

A p-type organic semiconductor (donor) according to comparative example 1 is commercially available poly(3-hexylthiophene) (P3HT) (manufactured by Rieke Metal), and the number average molecular weight thereof is 16500 in terms of polystyrene, and the polydispersity index thereof is 1.8. The solubility of P3HT with respect to 1 mL of chlorobenzene is 20 mg. The hole mobility evaluated by the SCLC method is $3.1*10^{-4}$ cm$^2$/Vs. The concentration of a coating liquid at the time of preparing an organic thin-film solar cell element is 2.0 percent by mass, and a drying temperature is about 110° C.

A p-type organic semiconductor according to comparative example 2 is a polymer P1 represented by the following Expression (1-1). The number average molecular weight of the polymer P1 is 18900 in terms of polystyrene, and the polydispersity index thereof is 2.1. The solubility of the polymer P1 with respect to 1 mL of chlorobenzene is 5 mg. The hole mobility evaluated by the SCLC method is $6.7*10^{-5}$ cm$^2$/Vs. The concentration of a coating liquid at the time of preparing an organic thin-film solar cell element is 0.5 percent by mass, and a drying temperature is about 25° C.

[Formula 8]

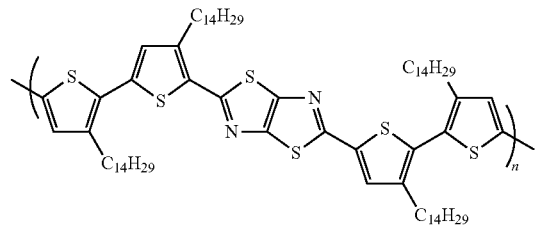

(1-1)

A p-type organic semiconductor according to comparative example 3 is a polymer P2 represented by the following Expression (1-2). The number average molecular weight of the polymer P2 is 13700 in terms of polystyrene, and the polydispersity index thereof is 1.8. The solubility of the polymer P2 with respect to 1 mL of chlorobenzene is 30 mg. The hole mobility evaluated by the SCLC method is $6.2*10^{-7}$ cm$^2$/Vs. The concentration of a coating liquid at the time of preparing an organic thin-film solar cell element is 1.0 percent by mass, and a drying temperature is about 25° C.

[Formula 9]

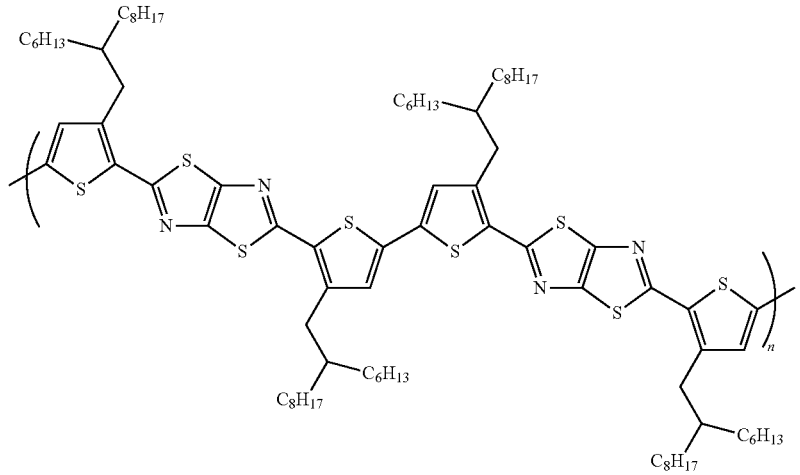

(1-2)

Respective p-type organic semiconductors according to comparative example 4, exemplary embodiment 1, and exemplary embodiment 2 are each a polymer P3 represented by the following Expression (1-3). The respective number average molecular weights, however, are different from one another.

[Formula 10]

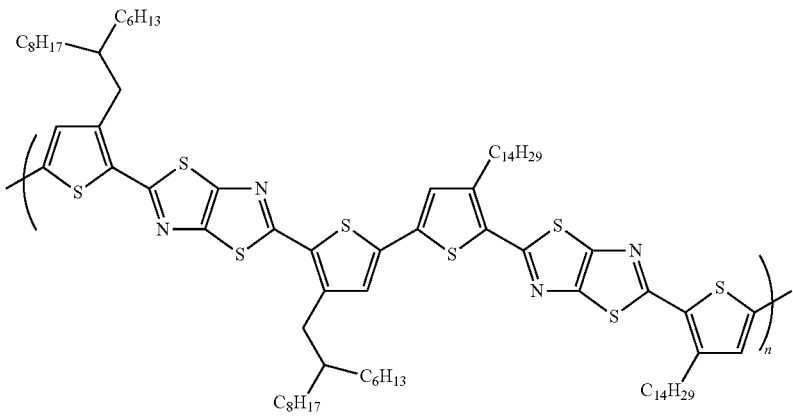

(1-3)

The number average molecular weight of the p-type organic semiconductor according to comparative example 4 is 10000 in terms of polystyrene, and the polydispersity index thereof is 1.6. The solubility of the polymer with respect to 1 mL of chlorobenzene is 20 mg. The hole mobility evaluated by the SCLC method is $6.2*10^{-5}$ cm$^2$/Vs. The concentration of a coating liquid at the time of preparing an organic thin-film solar cell element is 1.0 percent by mass, and a drying temperature is about 25° C.

The number average molecular weight of the p-type organic semiconductor according to exemplary embodiment 1 is 20200 in terms of polystyrene, and the polydispersity index thereof is 2.6. The solubility of the polymer with respect to 1 mL of chlorobenzene is 15 mg. The hole mobility evaluated by the SCLC method is $8.8*10^{-5}$ cm$^2$/Vs. The concentration of a coating liquid at the time of preparing an organic thin-film solar cell element is 0.8 percent by mass, and a drying temperature is about 25° C.

The number average molecular weight of the p-type organic semiconductor according to exemplary embodiment 2 is 32700 in terms of polystyrene, and the polydispersity index thereof is 9.1. The solubility of the polymer with respect to 1 mL of chlorobenzene is 12 mg. The hole mobility evaluated by the SCLC method is $1.3*10^{-4}$ cm$^2$/Vs. The concentration of a coating liquid at the time of preparing an organic thin-film solar cell element is 0.5 percent by mass, and a drying temperature is about 25° C.

A p-type organic semiconductor according to exemplary embodiment 3 is a polymer P4 represented by the following Expression (1-4). The number average molecular weight of the polymer P4 is 20000 in terms of polystyrene, and the polydispersity index thereof is 2.3. The solubility of the polymer P4 with respect to 1 mL of chlorobenzene is 12 mg. The hole mobility evaluated by the SCLC method is $9.4*10^{-5}$ cm$^2$/Vs. The concentration of a coating liquid at the time of preparing an organic thin-film solar cell element is 0.5 percent by mass, and a drying temperature is about 25° C.

[Formula 11]

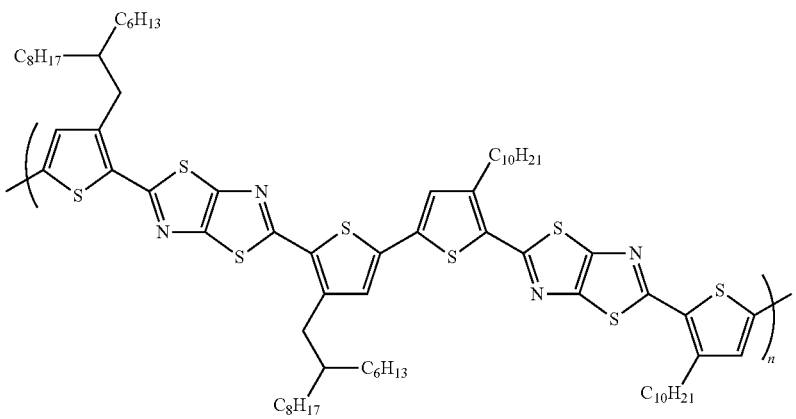

(1-4)

A p-type organic semiconductor according to exemplary embodiment 4 is a polymer P5 represented by the following Expression (1-5). The number average molecular weight of the polymer P5 is 35000 in terms of polystyrene, and the polydispersity index thereof is 3.0. The solubility of the polymer P5 with respect to 1 mL of chlorobenzene is 31 mg. The hole mobility evaluated by the SCLC method is $1.7*10^{-4}$ cm$^2$/Vs. The concentration of a coating liquid at the time of preparing an organic thin-film solar cell element is 0.5 percent by mass, and a drying temperature is about 25° C. In the present exemplary embodiment, the weight ratio between [60] PCBM and the p-type organic semiconductor was set to be 2:1.

[Formula 12]

(1-5)

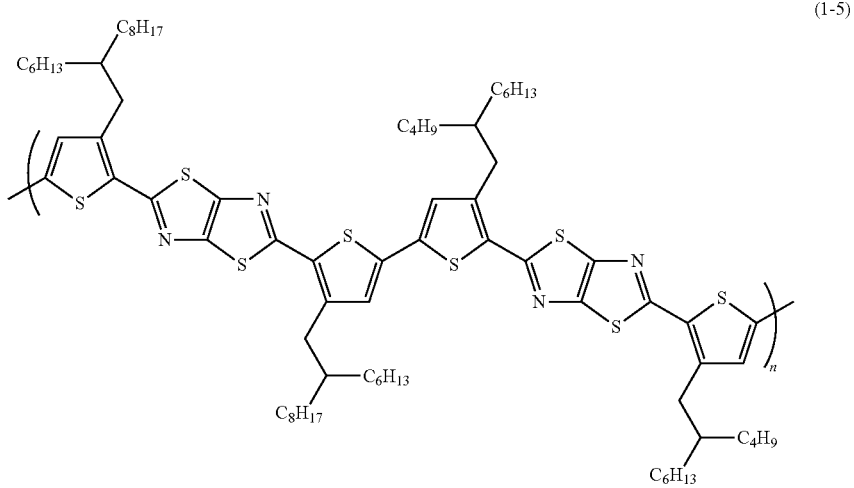

A p-type organic semiconductor according to exemplary embodiment 5 is a polymer P6 represented by the following Expression (1-6). The number average molecular weight of the polymer P6 is 22000 in terms of polystyrene, and the polydispersity index thereof is 500. The solubility of the polymer P6 with respect to 1 mL of chlorobenzene is 13 mg. The hole mobility evaluated by the SCLC method is $8.5*10^{-5}$ cm$^2$/Vs. The concentration of a coating liquid at the time of preparing an organic thin-film solar cell element is 0.5 percent by mass, and a drying temperature is about 25° C. In the present exemplary embodiment, the weight ratio between [60] PCBM and the p-type organic semiconductor was set to be 4:1.

A p-type organic semiconductor according to exemplary embodiment 6 is a polymer P7 represented by the following Expression (1-7). The number average molecular weight of the polymer P7 is 16000 in terms of polystyrene, and the polydispersity index thereof is 2.3. The solubility of the polymer P7 with respect to 1 mL of chlorobenzene is 21 mg. The hole mobility evaluated by the SCLC method is $8.1*10^{-5}$ cm$^2$/Vs. The concentration of a coating liquid at the time of preparing an organic thin-film solar cell element is 0.5 percent by mass, and a drying temperature is about 25° C. In the present exemplary embodiment, the weight ratio between [60] PCBM and the p-type organic semiconductor was set to be 3:1.

[Formula 13]

(1-6)

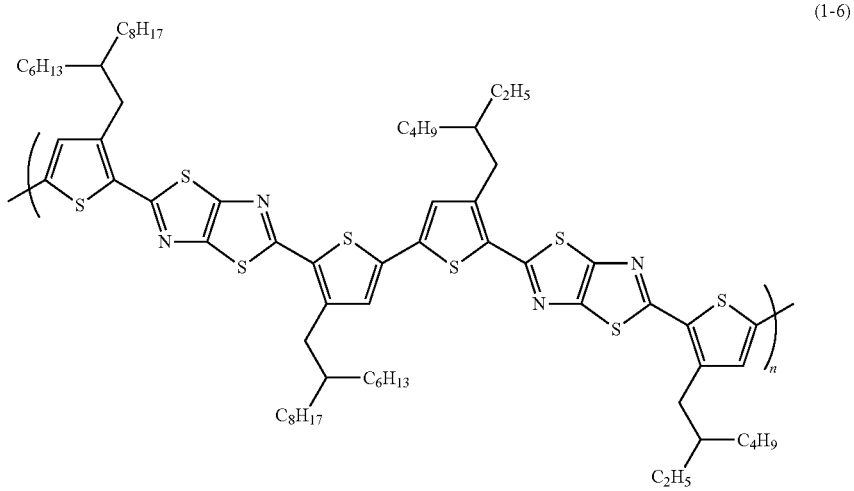

[Formula 14]

(1-7)

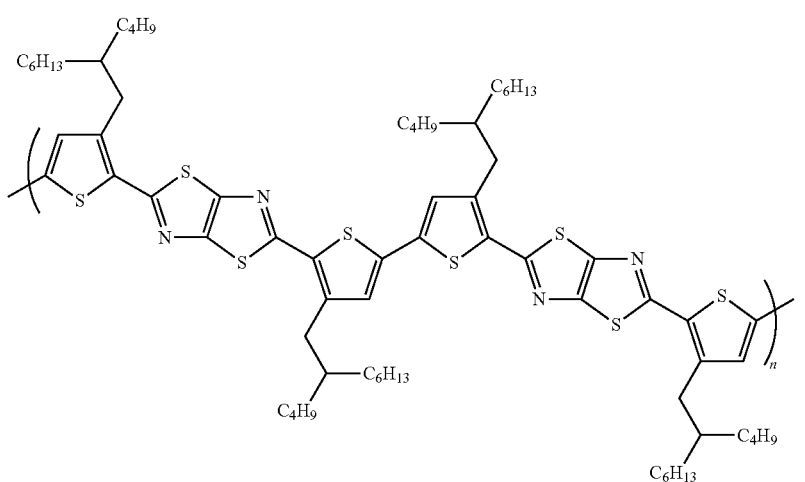

A p-type organic semiconductor according to exemplary embodiment 7 is a polymer P8 represented by the following Expression (1-8). The number average molecular weight of the polymer P8 is 48000 in terms of polystyrene, and the polydispersity index thereof is 3.0. The solubility of the polymer P8 with respect to 1 mL of chlorobenzene is 23 mg. The hole mobility evaluated by the SCLC method is $7.9*10^{-5}$ cm$^2$/Vs. The concentration of a coating liquid at the time of preparing an organic thin-film solar cell element is 0.5 percent by mass, and a drying temperature is about 25° C. In the present exemplary embodiment, the weight ratio between [60] PCBM and the p-type organic semiconductor was set to be 2:1.

A p-type organic semiconductor according to exemplary embodiment 8 is a polymer P9 represented by the following Expression (1-9). The number average molecular weight of the polymer P9 is 28000 in terms of polystyrene, and the polydispersity index thereof is 8.1. The solubility of the polymer P9 with respect to 1 mL of chlorobenzene is 22 mg. The hole mobility evaluated by the SCLC method is $7.8*10^{-5}$ cm$^2$/Vs. The concentration of a coating liquid at the time of preparing an organic thin-film solar cell element is 0.5 percent by mass, and a drying temperature is about 25° C. In the present exemplary embodiment, the weight ratio between [60] PCBM and the p-type organic semiconductor was set to be 2:1.

[Formula 15]

(1-8)

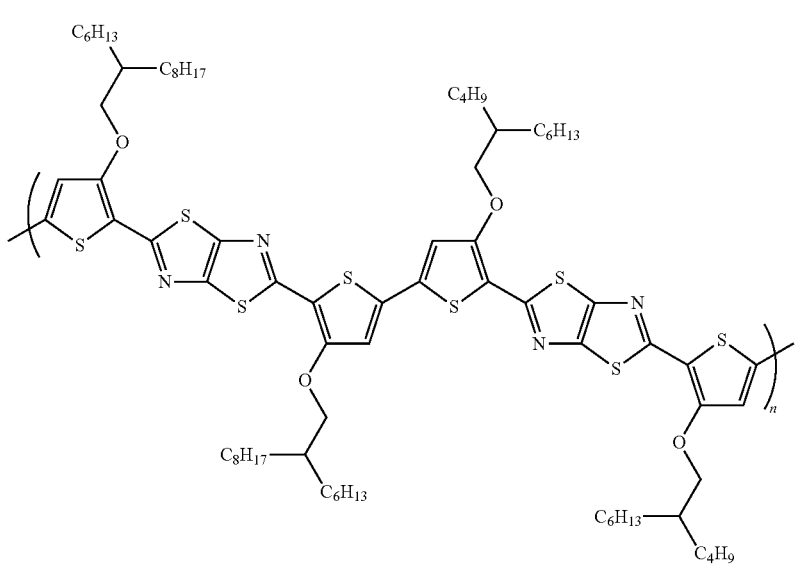

[Formula 16]

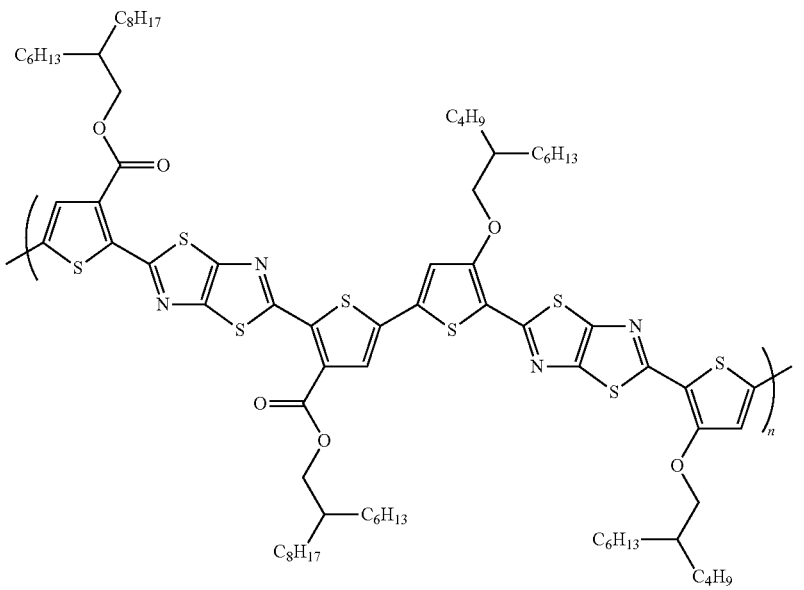

(1-9)

(Method for Synthesizing Polymers)

An explanation is given in the following regarding a method for synthesizing the respective polymers used in comparative examples 1 through 4. The p-type organic semiconductor used in comparative example 1 is commercially available poly(3-hexylthiophene) (P3HT) (manufactured by Rieke Metal), and the number average molecular weight thereof is 16500 in terms of polystyrene, and the polydispersity index thereof is 1.8. Comparative example 2 was synthesized in reference to non-patent document No. 1. Comparative examples 3 and 4 were synthesized in reference to non-patent document No. 2.

An explanation is given in the following regarding a method for synthesizing the respective polymers used in exemplary embodiments 1 through 3.

<Synthesis of 3-(2-hexyldecyl)thiophene> First, 3-(2-hexyldecyl)thiophene (A1) was synthesized in accordance with the following reaction formula.

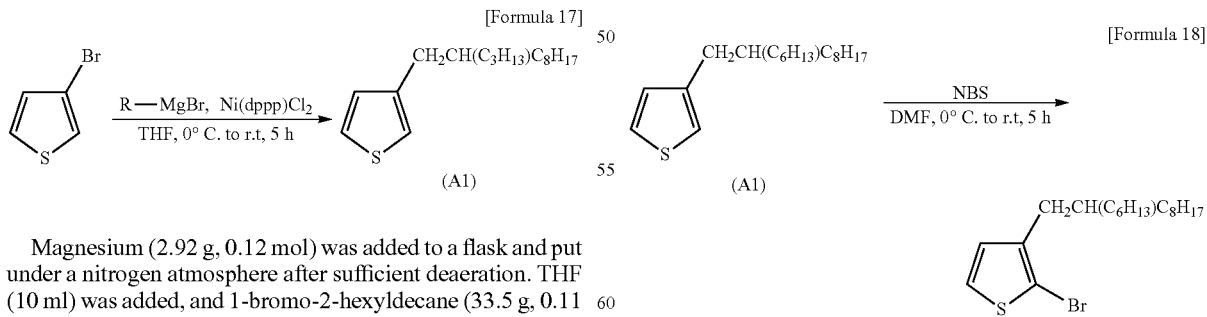

Magnesium (2.92 g, 0.12 mol) was added to a flask and put under a nitrogen atmosphere after sufficient deaeration. THF (10 ml) was added, and 1-bromo-2-hexyldecane (33.5 g, 0.11 mol) was dropped while refluxing THF. After the dropping, refluxing was similarly performed for three hours. THF (190 ml) was then added, and the flask was cooled to room temperature.

Ni(dppp)Cl$_2$ (542 mg, 1 mmol) was added to another flask and put under a nitrogen atmosphere after sufficient deaeration. THF (200 ml) and 3-bromothiophene (9.5 ml, 16.3 g, 0.1 mol) were added, and a synthesized Grignard reagent was dropped. The mixture was stirred overnight at room temperature. Then, 1N hydrochloric acid (50 ml) was added to the reaction solution, followed by extraction with hexane, and an organic layer was washed with a saturated saline solution and water. The organic layer was dried with anhydrous magnesium sulfate, and, after filtration, the solvent was distilled off under reduced pressure. By distilling the obtained reaction mixture under reduced pressure, 3-(2-hexyldecyl)thiophene (A1) was obtained as clear oil (16 g, 52% yield). The product (A1) obtained was identified using a $^1$H-NMR method. $^1$H-NMR (400 MH$_z$, CDCl$_3$, TMS) δ 7.23 (dd, J=4.9 Hz, 1.0 Hz, 1 H), 6.93 (d, J=4.9 Hz, 1 H), 6.92 (d, J=1.0 Hz, 1 H), 2.55 (d, J=6.8 Hz, 2 H), 1.25 (m, 25 H), 0.88 (m, 6 H)

Synthesis of 2-bromo-3-(2-hexyldecyl)thiophene

Then, 2-bromo-3-(2-hexyldecyl)thiophene (A2) was synthesized in accordance with the following reaction formula.

Under a nitrogen atmosphere, 3-(2-hexyldecyl)thiophene (10 g, 32.4 mmol) and THF (100 ml) were added and then cooled to 0° C. NBS (5.75 g, 32.4 mmol) was slowly added, and the temperature was increased to room temperature. The mixture was then stirred overnight. Then, a saturated sodium hydrogen carbonate aqueous solution (50 ml) was added to the reaction solution, followed by extraction with hexane, and an organic layer was washed with a saturated saline solution and water. The organic layer was dried with anhydrous magnesium sulfate, and, after filtration, the solvent was distilled off under reduced pressure. By separating and purifying the obtained reaction mixture by silica gel column chromatography in which hexane was used as a mobile phase, 2-bromo-3-(2-hexyldecyl)thiophene (A2) was obtained as clear oil (12.4 g, 99% yield). The product (A2) obtained was identified using a $^1$H-NMR method. $^1$H-NMR (400 MH$_Z$, CDCl$_3$, TMS) δ 7.17 (d, J=5.4 Hz, 1 H), 6.75 (d, J=5.4 Hz, 1 H), 2.49 (d, J=7.0 Hz, 2 H), 1.25 (m, 25 H), 0.88 (m, 6 H)

Synthesis of 3-(2-hexyldecyl)-2thiophenaldehyde

Then, 3-(2-hexyldecyl)-2thiophenaldehyde (A3) was synthesized in accordance with the following reaction formula.

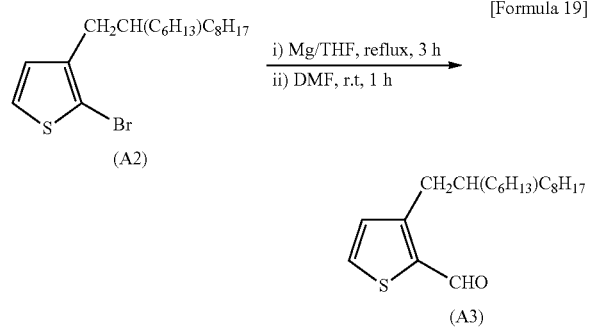

[Formula 19]

Magnesium (345 mg, 14.2 mmol) was added to a flask and put under a nitrogen atmosphere after sufficient deaeration. THF (10 ml) was added, and 2-bromo-3-(2-hexyldecyl)thiophene (A2) (5 g, 12.9 mmol) was dropped while refluxing THF. After the dropping, refluxing was similarly performed for three hours. THF (40 ml) was then added, and the flask was cooled to 0° C. DMF (10 ml) was dropped, and the temperature was increased to room temperature. The mixture was then stirred overnight. To the reaction solution, 1N hydrochloric acid (20 ml) was added, followed by extraction with chloroform. An organic layer was then washed with a saturated saline solution and water. The organic layer was dried with anhydrous magnesium sulfate, and, after filtration, the solvent was distilled off under reduced pressure. By separating and purifying the obtained reaction mixture by silica gel column chromatography in which a mixed solvent of hexane and chloroform was used as a mobile phase, 3-(2-hexyldecyl)-2thiophenaldehyde (A3) was obtained as clear oil (3.0 g, 69% yield). The product (A3) obtained was identified using a $^1$H-NMR method. $^1$H-NMR (400 MH$_Z$, CDCl$_3$, TMS) δ 10.03 (s, 1 H), 7.64 (d, J=4.9 Hz, 1 H), 6.97 (d, J=4.9 Hz, 1 H), 2.88 (d, J=7.3 Hz, 2 H), 1.25 (m, 25 H), 0.88 (m, 6 H)

Synthesis of 2,5-bis(3(2-hexyldecyl)thiophene-2-yl)thiazolo[5,4-d]thiazole

Then, 2,5-bis(3(2-hexyldecyl)thiophene-2-yl) thiazolo[5,4-d]thiazole (A4) was synthesized in accordance with the following reaction formula.

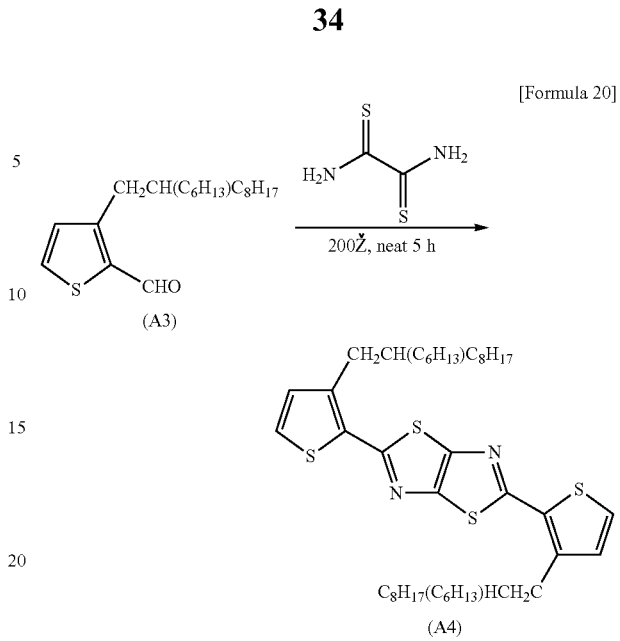

[Formula 20]

Under a nitrogen atmosphere, 3-(2-hexyldecyl)-2thiophenaldehyde (3.00 g, 8.91 mmol) (A3) and rubeanic acid (375 mg, 2.97 mmol) were added to a flask equipped with Dean-Stark, then heated to 200° C., and stirred for five hours. Then, the reaction mixture was extracted with chloroform, and an organic layer was washed with a saturated saline solution and water. The organic layer was dried with anhydrous magnesium sulfate, and, after filtration, the solvent was distilled off under reduced pressure. By separating and purifying the obtained reaction mixture by silica gel column chromatography in which a mixed solvent of hexane and chloroform was used as a mobile phase, 2,5-bis(3(2-hexyldecyl)thiophene-2-yl)thiazolo[5,4-d]thiazole (A4) was obtained as a yellow solid (630 mg, 28% yield). The product (A4) obtained was identified using a $^1$H-NMR method. $^1$H-NMR (400 MH$_Z$, CDCl$_3$, TMS) δ 7.34 (d, J=5.4 Hz, 1 H), 6.95 (d, j=5.4 Hz, 1 H), 2.93 (d, J=7.4 Hz, 2 H), 1.25 (m, 25 H), 0.88 (m, 6 H)

Synthesis of 2,5-bis(5-bromo-3(2-hexyldecyl)thiophene-2-yl)thiazolo[5,4-d]thiazole Then, 2,5-bis(5-bromo-3(2-hexyldecyl)thiophene-2-yl) thiazolo[5,4-d]thiazole (A5) was synthesized in accordance with the following reaction formula.

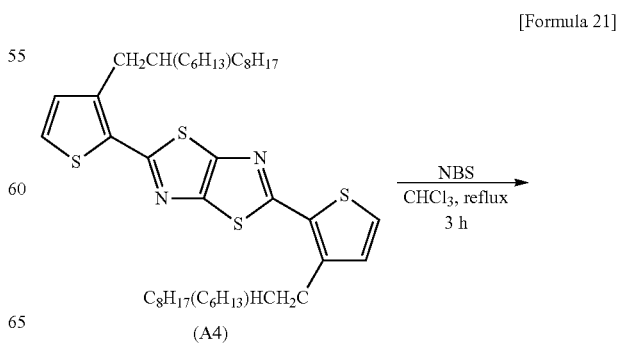

[Formula 21]

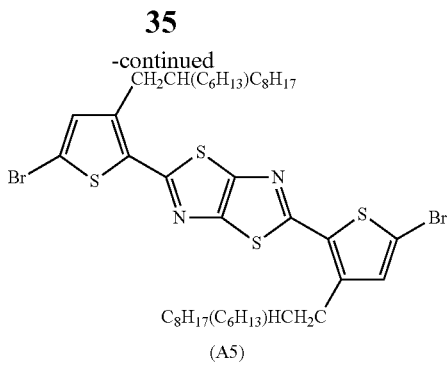

(A5)

Under a nitrogen atmosphere, 2,5-bis(3(2-hexyldecyl)thiophene-2-yl)thiazolo[5,4-d]thiazole (630 mg, 0.83 mmol) (A4), NBS (445 mg, 2.5 mmol), and chloroform (50 ml) were added to a flask, and refluxing was performed for three hours. Then, the flask was cooled to room temperature. A saturated sodium hydrogen carbonate aqueous solution (50 ml) was then added to the reaction solution, followed by extraction with chloroform, and an organic layer was washed with a saturated saline solution and water. The organic layer was dried with anhydrous magnesium sulfate, and, after filtration, the solvent was distilled off under reduced pressure. By separating and purifying the obtained reaction mixture by silica gel column chromatography in which a mixed solvent of hexane and chloroform was used as a mobile phase, 2,5-bis(5-bromo-3(2-hexyldecyl)thiophene-2-yl)thiazolo[5,4-d]thiazole (A5) was obtained as a yellow solid (620 mg, 82% yield). The obtained purified product was used in the synthesis of the polymer according to exemplary embodiment 1. Meanwhile, for a purified product used in the synthesis of the respective polymers according to exemplary embodiments 2 and 3, the following purification method was applied. By separating and purifying the obtained reaction mixture by silica gel column chromatography in which a mixed solvent of hexane and chloroform was used as a mobile phase, followed by further separation and purification by preparative gel-permeation chromatography in which chloroform was used as a mobile phase, 2,5-bis(5-bromo-3(2-hexyldecyl)thiophene-2-yl)thiazolo[5,4-d]thiazole (5) was obtained as a yellow solid (552 mg, 73% yield). The product (A5) obtained was identified using a $^1$H-NMR method. $^1$H-NMR (400 MH$_z$, CDCl$_3$, TMS) δ 6.90 (d, J=5.4 Hz, 1 H), 2.84 (d, J=7.5 Hz, 2 H), 1.25 (m, 25 H), 0.88 (m, 6 H)

Synthesis of 3-(tetradecyl)thiophene

[Formula 22]

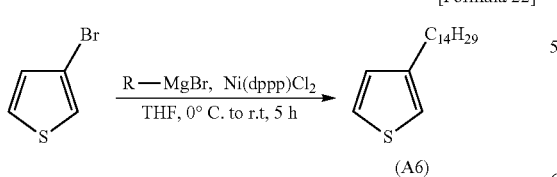

The synthesis of 3-(tetradecyl)thiophene (A6) was performed using the same procedure as in the synthesis of 3-(2-hexyldecyl)thiophene (A1), and 3-(tetradecyl)thiophene (A6) was obtained as clear oil (73% yield). The product (A6) obtained was identified using a $^1$H-NMR method. $^1$H-NMR (400 MH$_z$, CDCl$_3$, TMS) δ 7.24 (dd, J=4.9 Hz, 1.0 Hz, 1 H), 6.93 (d, J=4.9 Hz, 1 H), 6.92 (d, J=1.0 Hz, 1 H), 2.62 (t, J=7.7 Hz, 2 H), 1.25 (m, 24 H), 0.88 (m, 3 H)

Synthesis of 2-bromo-3-(tetradecyl)thiophene

[Formula 23]

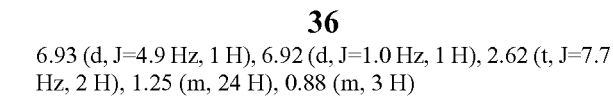

The synthesis of 2-bromo-3-(tetradecyl)thiophene (A7) was performed using the same procedure as in the synthesis of 2-bromo-3-(2-hexyldecyl)thiophene (A2), and 2-bromo-3-(tetradecyl)thiophene (A7) was obtained as clear oil (99% yield). The product (A7) obtained was identified using a $^1$H-NMR method. $^1$H-NMR (400 MH$_z$, CDCl$_3$, TMS) δ 7.18 (d, J=5.6 Hz, 1 H), 6.79 (d, J=5.6 Hz, 1 H), 2.56 (t, J=7.7 Hz, 2 H), 1.25 (m, 24 H), 0.88 (m, 3 H)

Synthesis of 3-(tetradecyl)-2thiophenaldehyde

[Formula 24]

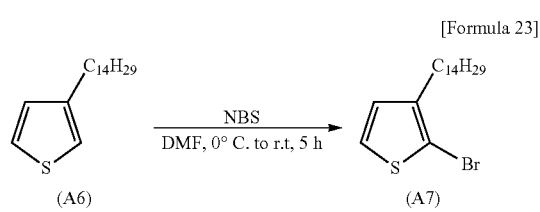

The synthesis of 3-(tetradecyl)-2thiophenaldehyde (A8) was performed using the same procedure as in the synthesis of 3-(2-hexyldecyl)-2thiophenaldehyde (A3), and 3-(tetradecyl)-2thiophenaldehyde (A8) was obtained as clear oil (72% yield). The product (A8) obtained was identified using a $^1$H-NMR method. $^1$H-NMR (400 MH$_z$, CDCl$_3$, TMS) δ 10.04 (s, 1 H), 7.64 (d, J=4.9 Hz, 1 H), 7.00 (d, J=4.9 Hz, 1 H), 2.96 (t, J=7.7 Hz, 2 H), 1.25 (m, 24 H), 0.88 (m, 3 H)

Synthesis of 2,5-bis(3(tetradecyl)thiophene-2-yl)thiazolo[5,4-d]thiazole

[Formula 25]

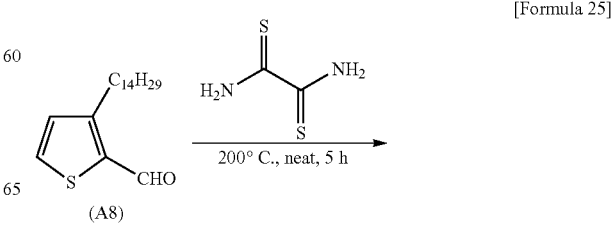

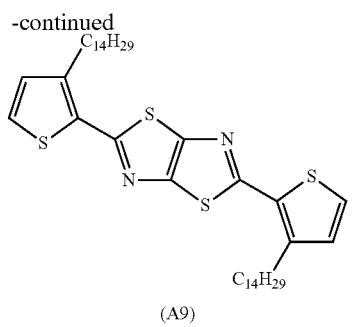

(A9)

The synthesis of 2,5-bis(3(tetradecyl)thiophene-2-yl)thiazolo[5,4-d]thiazole (A9) was performed using the same procedure as in the synthesis of 2,5-bis(3(2-hexyldecyl)thiophene-2-yl)thiazolo[5,4-d]thiazole (A4), and 2,5-bis(3(tetradecyl)thiophene-2-yl)thiazolo[5,4-d]thiazole (A9) was obtained as a yellow solid (30% yield). The product (A9) obtained was identified using a $^1$H-NMR method. $^1$H-NMR (400 MH$_z$, CDCl$_3$, TMS) δ 7.38 (d, J=5.1 Hz, 1 H), 6.99 (d, J=5.1 Hz, 1 H), 2.97 (t, J=7.8 Hz, 2 H), 1.25 (m, 25 H), 0.88 (m, 6 H)

Synthesis of 2,5-bis(5-bromo-3(tetradecyl)thiophene-2-yl)thiazolo[5,4-d]thiazole

[Formula 26]

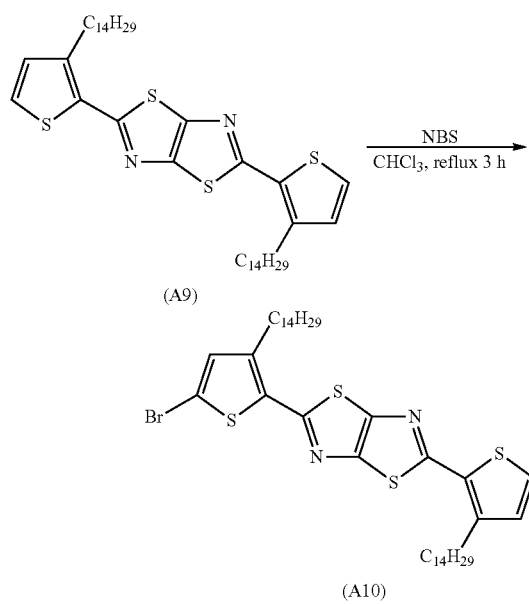

The synthesis of 2,5-bis(5-bromo-3(tetradecyl)thiophene-2-yl)thiazolo[5,4-d]thiazole (A10) was performed using the same procedure as in the synthesis of 2,5-bis(5-bromo-3-(2-hexyldecyl)thiophene-2-yl)thiazolo[5,4-d]thiazole (A5), and 2,5-bis(5-bromo-3(tetradecyl)thiophene-2-yl)thiazolo[5,4-d]thiazole (A10) was obtained as a yellow solid (85% yield). The product (A10) obtained was identified using a $^1$H-NMR method. $^1$H-NMR (400 MH$_z$, CDCl$_3$, TMS) δ 6.95 (d, J=5.4 Hz, 1 H), 2.88 (d, J=7.5 Hz, 2 H), 1.25 (m, 25 H), 0.88 (m, 6 H)

Synthesis of 2,5-bis(3-tetradecyl-5-trimethylstannyl)thiophene-2-yl)thiazolo[5,4-d]thiazole

[Formula 27]

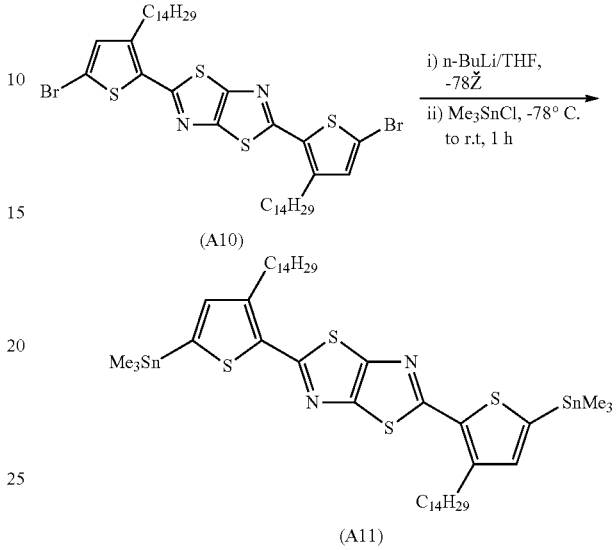

Under a nitrogen atmosphere, 2,5-bis(5-bromo-3(tetradecyl)thiophene-2-yl)thiazolo[5,4-d]thiazole (A10) (500 mg, 0.58 mmol) and THF (20 ml) were added and cooled to −78° C. Then, n-BuLi (1.46 mmol, 0.88 ml, 1.67 M) was dropped and stirred at the same temperature for one hour. Me$_3$SnCl (350 mg, 1.75 mmol) was then added, and the temperature was increased to room temperature. The mixture was then stirred for another hour. Then, water was added to the reaction solution. The reaction solution was then extracted with chloroform, and an organic layer was washed with a saturated saline solution and water. The organic layer was dried with anhydrous magnesium sulfate, and, after filtration, the solvent was distilled off under reduced pressure. By separating and purifying the obtained mixture by alumina column chromatography in which hexane was used as a mobile phase, 2,5-bis(3-tetradecyl-5-trimethylstannyl)thiophene-2-yl)thiazolo[5,4-d]thiazole was obtained as a yellow solid (390 mg, 65% yield). The purified product obtained was used in the synthesis of the polymer according to exemplary embodiment 1. Meanwhile, for the purified product used in the synthesis of the polymer according to exemplary embodiment 2, the following purification method was applied. By recrystallizing the obtained mixture twice using hexane, 2,5-bis(3-tetradecyl-5-trimethylstannyl)thiophene-2-yl)thiazolo[5,4-d]thiazole was obtained as a yellow solid. The product (A11) obtained was identified using a $^1$H-NMR method. $^1$H-NMR (400 MH$_z$, CDCl$_3$, TMS) δ 7.03 (d, J=5.4 Hz, 1 H), 2.96 (d, J=7.5 Hz, 2 H), 1.25 (m, 25 H), 0.88 (m, 6 H), 0.40 (s, 9 H)

Synthesis of 2,5-bis(3-decyl-5-trimethylstannyl)thiophene-2-yl)thiazolo[5,4-d]thiazole (A12)

Using the same procedure as in the synthesis of the raw-material monomer A11 except for using 1-bromdecan as a starting material, 2,5-bis(3-decyl-5-trimethylstannyl)thiophene-2-yl)thiazolo[5,4-d]thiazole (A12) was synthesized.

Synthesis of 2,5-bis(5-bromo-3-(2-butyloctyl) thiophene-2-yl)thiazolo[5,4-d]thiazole (A13)

Using the same procedure as in the synthesis of the raw-material monomer A5 except for using 1-bromo-2-butyloctane as a starting material, 2,5-bis(5-bromo-3-(2-butyloctyl) thiophene-2-yl)thiazolo[5,4-d]thiazole (A13) was synthesized.

Synthesis of 2,5-bis(3-(2-butyloctyl)-5-trimethylstannyl)thiophene-2-yl)thiazolo[5,4-d]thiazole (A14)

Using the same procedure as in the synthesis of A11 from A10 except for using A13 as a starting material, 2,5-bis(3-(2-butyloctyl)-5-trimethylstannyl)thiophene-2-yl)thiazolo[5,4-d]thiazole (A14) was synthesized.

Synthesis of 2,5-bis(3-(2-ethylhexyl)-5-trimethylstannyl)thiophene-2-yl)thiazolo[5,4-d]thiazole (A15)

Using the same procedure as in the synthesis of the raw-material monomer A11 except for using 1-bromo-2-ethylhexane as a starting material, 2,5-bis(3-(2-ethylhexyl)-5-trimethylstannyl)thiophene-2-yl)thiazolo[5,4-d]thiazole (A15) was synthesized.

Synthesis of 2,5-bis(3-(2-butyloctoxy)-5-trimethylstannyl)thiophene-2-yl)thiazolo[5,4-d]thiazole (A16)

In accordance with the following procedure, 2,5-bis(3-(2-butyloctoxy)-5-trimethylstannyl)thiophene-2-yl)thiazolo[5,4-d]thiazole (A16) was synthesized.

(1) Synthesis of 3-methoxythiophene

Under a nitrogen atmosphere, ethanol (60 ml) was added to a flask provided with Dean-Stark, and sodium (6.9 g, 300 mmol) was then added, in an ice bath, and stirred for 30 minutes. Then, NMP (50 ml) was added, and the reaction solution was heated at 110° C. After removing methanol, 3-bromothiophene (32.6 g, 200 mmol) and copper bromide (2.9 g, 20 mmol) were added and stirred for 45 minutes at 110° C. The reaction solution was then cooled to room temperature, and water was added to the reaction solution. The reaction solution was then extracted with pentane, and an organic layer was washed with a saturated saline solution and water. The organic layer was dried with anhydrous magnesium sulfate, and, after filtration, the solution was distilled off under reduced pressure. By distilling the obtained reaction mixture under reduced pressure, a target substance was obtained as clear oil (65% yield). $^1$H-NMR (400 MH$_z$, CDCl$_3$, TMS) δ 7.18 (dd, J=4.8 Hz, 2.8 Hz, 1 H), 6.75 (dd, J=4.8 Hz, 1.9 Hz, 1 H), 6.25 (d, J=1.9 Hz, 1 H), 3.81 (s, 3 H)

(2) Synthesis of 3-(2-butyloctoxy)thiophene

Under a nitrogen atmosphere, 3-methoxythiophene (5.0 g, 44.8 mmol), 2-butyloctanol (16.7 g, 89.6 mmol), and p-toluenesulfonic acid (850 mg, 4.48 mmol) were dissolved in toluene (40 ml), and refluxing was performed for 15 hours. Then, water was added to the reaction solution. The reaction solution was then extracted with methylene chloride, and an organic layer was washed with a saturated saline solution and water. The organic layer was dried with anhydrous magnesium sulfate, and, after filtration, the solution was distilled off under reduced pressure. By separating and purifying the obtained reaction solution by silica gel column chromatography in which hexane was used as a mobile phase, a target substance was obtained as clear oil (83% yield). $^1$H-NMR (400 MH$_z$, CDCl$_3$, TMS) δ 7.17 (dd, J=5.2 Hz, 1.6 Hz, 1 H), 6.76 (d, J=5.2 Hz, 1 H), 6.21 (d, J=1.6 Hz, 1 H), 3.81 (d, J=5.8 Hz, 2 H), 1.25 (m, 17 H), 0.88 (m, 6 H)

(3) Synthesis of 2-formyl-3-(2-butyloctoxy)thiophene

Under a nitrogen atmosphere, phosphorous oxychloride (3.5 ml, 40 mmol) was slowly dropped into DMF (70 ml) at 0° C. and stirred for 10 minutes. Then, a DMF (15 ml) solution of 3-(2-butyloctoxy)thiophene (9 g, 30.4 mmol) was slowly dropped into the reaction solution. The reaction solution was then heated for two hours at 70° C. Then, the reaction solution was cooled to room temperature. While cooling the reaction solution in a water bath, a 10% aqueous sodium hydroxide solution was slowly added and stirred for 30 minutes. Then, the reaction solution was extracted with chloroform, and an organic layer was washed with a saturated saline solution and water. The organic layer was dried with anhydrous magnesium sulfate, and, after filtration, the solution was distilled off under reduced pressure. By separating and purifying the obtained reaction mixture by silica gel column chromatography in which a mixed solvent of hexane and ethyl acetate was used as a mobile phase, a target substance was obtained as clear oil (80% yield). $^1$H-NMR (400 MH$_z$, CDCl$_3$, TMS) δ 10.00 (s, 1 H), 7.67 (d, J=4.8 Hz, 1 H), 6.84 (d, J=4.8 Hz, 1 H), 4.03 (d, J=4.8 Hz, 2 H), 1.25 (m, 17 H), 0.88 (m, 6 H)

(4) Synthesis of 2,5-bis(3-(2-butyloctoxy)thiophene-2-yl)thiazolo[5,4-d]thiazole Under a nitrogen atmosphere, 2-formyl-3-(2-butyloctoxy)thiophene (7 g, 23.6 mmol) and rubeanic acid (1.42 g, 11.8 mmol) were added to a flask equipped with Dean-Stark, then heated to 200° C., and stirred for five hours. Then, the reaction mixture was extracted with chloroform, and an organic layer was washed with a saturated saline solution and water. The organic layer was dried with anhydrous magnesium sulfate, and, after filtration, the solvent was distilled off under reduced pressure. By separating and purifying the obtained reaction mixture by silica gel column chromatography in which a mixed solvent of hexane and chloroform was used as a mobile phase, a target substance was obtained as a yellow solid (29% yield). $^1$H-NMR (400 MH$_z$, CDCl$_3$, TMS) δ 7.31 (d, J=5.6 Hz, 1 H), 6.88 (d, J=5.6 Hz, 1 H), 4.13 (d, J=4.8 Hz, 2 H), 1.25 (m, 17 H), 0.88 (m, 6 H)

(5) Synthesis of 2,5-bis(5-bromo-3-(2-butyloctoxy) thiophene-2-yl)thiazolo[5,4-d]thiazole Under a nitrogen atmosphere, 2,5-bis(3-(2-butyloctoxy) thiophene-2-yl)thiazolo[5,4-d]thiazole (2.3 g, 3.4 mmol), NBS (1.33 g, 7.4 mmol), chloroform (80 ml), and acetic acid (40 ml) were added to a flask and stirred for three hours at 0°

C. Then, a saturated sodium hydrogen carbonate aqueous solution was added to the reaction solution, followed by extraction with chloroform, and an organic layer was washed with a saturated saline solution and water. The organic layer was dried with anhydrous magnesium sulfate, and, after filtration, the solvent was distilled off under reduced pressure. By separating and purifying the obtained reaction mixture by silica gel column chromatography in which a mixed solvent of hexane and chloroform was used as a mobile phase, followed by recrystallization using hexane, a target substance was obtained as a yellow solid (85% yield). $^1$H-NMR (400 MH$_Z$, CDCl$_3$, TMS) δ 6.90 (s, 1 H), 4.09 (d, J=4.8 Hz, 2 H), 1.25 (m, 17 H), 0.88 (m, 6 H)

(6) Synthesis of 2,5-bis(3-(2-butyloctoxy)-5-trimethylstannyl)thiophene-2-yl)thiazolo[5,4-d]thiazole (A16)

Under a nitrogen atmosphere, 2,5-bis(5-bromo-3-(2-butyloctoxy)thiophene-2-yl)thiazolo[5,4-d]thiazole (416 mg, 0.5 mmol) and THF (20 ml) were added and cooled to −78° C. Then, n-BuLi (1.25 mmol, 0.78 ml, 1.60 M) was dropped and stirred at the same temperature for one hour. Me$_3$SnCl (300 mg, 1.5 mmol) was then added, and the temperature was increased to room temperature. The mixture was then stirred for another hour. Then, water was added to the reaction solution. The reaction solution was then extracted with chloroform, and an organic layer was washed with a saturated saline solution and water. The organic layer was dried with anhydrous magnesium sulfate, and, after filtration, the solvent was distilled off under reduced pressure. By recrystallizing the obtained mixture twice (at low temperature in a refrigerator or the like) using hexane, a target substance (A16) was obtained as a yellow solid (60% yield). $^1$H-NMR (400 MH$_Z$, CDCl$_3$, TMS) δ 6.92 (s, 1 H), 4.16 (d, J=4.8 Hz, 2 H), 1.25 (m, 17 H), 0.88 (m, 6 H), 0.41 (s, 9 H)

Synthesis of 2,5-bis(5-bromo-3-(2-hexyldethoxy)thiophene-2-yl)thiazolo[5,4-d]thiazole (A17)

Using the same procedure as in the synthesis of the raw-material monomer A16 except for using 2-hexyldecanol instead of 2-butyloctanol, 2,5-bis(5-bromo-3-(2-hexyldethoxy)thiophene-2-yl)thiazolo[5,4-d]thiazole (A17) was synthesized.

Synthesis of bis(2-hexyldecyl) 2,2'-(thiazolo[5,4-d]thiazole)bis(5-bromothiophene-3-carboxylate) (A18)

In accordance with the following procedure, bis(2-hexyldecyl) 2,2'-(thiazolo[5,4-d]thiazole)bis(5-bromothiophene-3-carboxylate) (A18) was synthesized.

(1) Synthesis of 5-bromo-3-thiophenecarboxylic acid

Under a nitrogen atmosphere, 3-thiophenecarboxylic acid (10 g, 78 mmol) was added to acetic acid (100 ml), and bromine (12.5 g, 78 mmol) was then slowly dropped and stirred at the same temperature for one hour. Then, ice (300 g) was added. By filtering a precipitated white solid and then drying the white solid after washing with water, a target substance was obtained as a white solid (80% yield). $^1$H-NMR (400 MH$_Z$, CDCl$_3$, TMS) δ 8.12 (s, 1 H), 7.51 (s, 1 H)

(1) Synthesis of 5-bromo-2-formyl-3-thiophenecarboxylic acid

Under a nitrogen atmosphere, 5-bromo-3-thiophenecarboxylic acid (12 g, 58 mmol) was added to THF (300 ml), and LDA (174 mmol, 232 ml, 0.75 M) was slowly dropped at −78° C. Then, the mixture was stirred for two hours at −30° C., and DMF was slowly dropped at −78° C. Then, water was added to the reaction solution. The reaction solution was then extracted with ethyl acetate, and an organic layer was washed with a saturated saline solution and water. The organic layer was dried with anhydrous magnesium sulfate, and, after filtration, the solvent was distilled off under reduced pressure. With this, a target substance was obtained as a solid (95% yield, crude product). $^1$H-NMR (400 MH$_Z$, CDCl$_3$, TMS) δ 10.44 (s, 1 H), 7.63 (s, 1 H)

(3) 2-hexyldecyl 5-bromo-2-formyl-3-thiophenecarboxylate

Under a nitrogen atmosphere, 5-bromo-2-formyl-3-thiophenecarboxylic acid (12 g, 51 mmol) was added to DMF (200 ml), and sodium carbonate (27 g, 255 mmol) was then added. Then, the mixture was heated for 10 hours at 120° C. and then cooled to room temperature, and water was added to the reaction solution. The reaction solution was then extracted with ethyl acetate, and an organic layer was washed with a saturated saline solution and water. The organic layer was dried with anhydrous magnesium sulfate, and, after filtration, the solvent was distilled off under reduced pressure. By separating and purifying the obtained mixture by silica gel column chromatography in which a mixed solvent of hexane and chloroform was used as a mobile phase, a target substance was obtained as clear oil (55% yield). $^1$H-NMR (400 MH$_Z$, CDCl$_3$, TMS) δ 10.50 (s, 1 H), 7.52 (s, 1 H), 4.26 (d, J=5.9 Hz, 2 H), 1.25 (m, 25 H), 0.88 (m, 6 H)

(4) Synthesis of bis(2-hexyldecyl) 2,2'-(thiazolo[5,4-d]thiazole)bis(5-bromothiophene-3-carboxylate) (A17)

Under a nitrogen atmosphere, 2-hexyldecyl 5-bromo-2-formyl-3-thiophenecarboxylate (6 g, 13 mmol) and rubeanic acid (780 mg, 6.5 mmol) were added to DMF (100 ml), then heated to 140° C., and stirred for eight hours while making sure by using TLC that a raw material was consumed. Then, the reaction mixture was extracted with chloroform, and an organic layer was washed with a saturated saline solution and water. The organic layer was dried with anhydrous magnesium sulfate, and, after filtration, the solvent was distilled off under reduced pressure. By separating and purifying the obtained reaction mixture by silica gel column chromatography in which a mixed solvent of hexane and chloroform was used as a mobile phase, followed by recrystallization using hexane, a target substance (A18) was obtained as a yellow solid (9% yield). $^1$H-NMR (400 MH$_Z$, CDCl$_3$, TMS) δ 7.45 (s, 1 H), 4.26 (d, J=4.8 Hz, 2 H), 1.25 (m, 25 H), 0.88 (m, 6 H)

Synthesis of Polymer P3 used in Exemplary Embodiment 1

Polymer P3 used in exemplary embodiment 1 was synthesized in accordance with the following reaction formula.

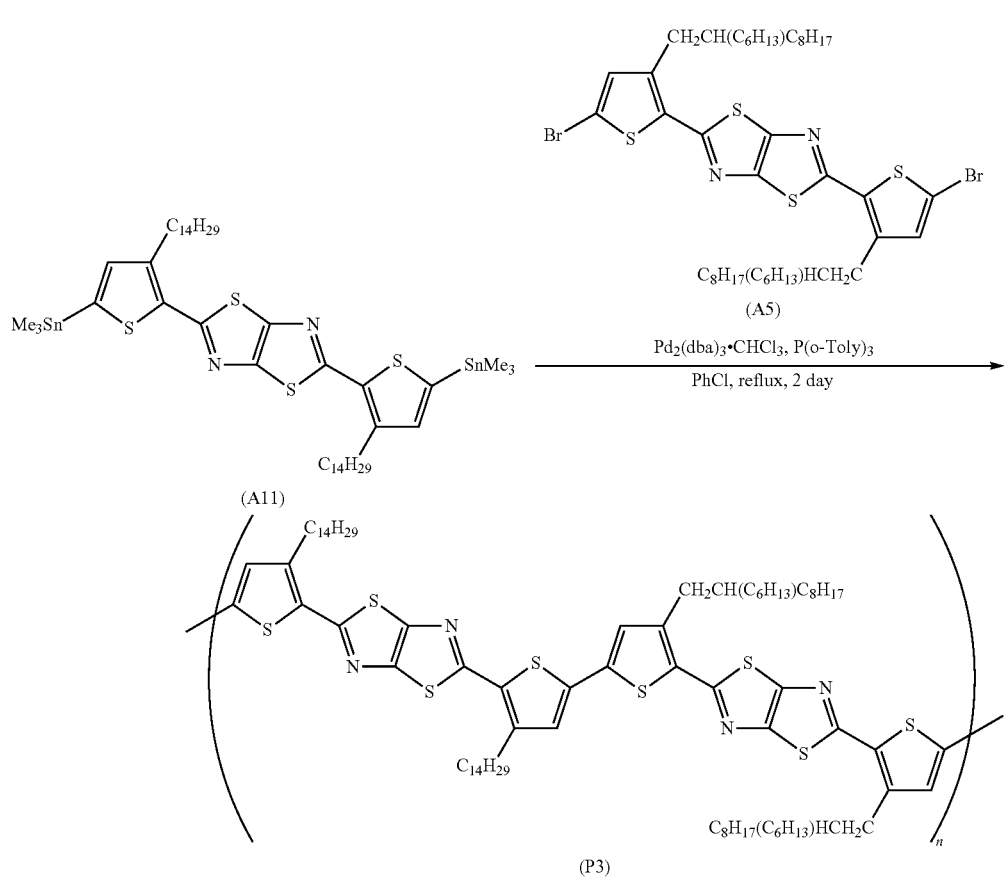

[Formula 28]

Under a nitrogen atmosphere, chlorobenzene (10 ml) was added and deaerated for 30 minutes. $Pd_2(dba)_3 \cdot CHCl_3$ (2.0 mg, 0.002 mmol), $P(o\text{-tolyl})_3$ (4.4 mg, 0.008 mmol), 2,5-bis(5-bromo-3(2-hexyldecyl)thiophene-2-yl)thiazolo[5,4-d]thiazole (A5) (91 mg, 0.1 mmol), and 2,5-bis(3-tetradecyl-5-trimethylstannyl)thiophene-2-yl)thiazolo[5,4-d]thiazole (A11) (102 mg, 0.1 mmol) were added, and refluxing and stirring were performed for three days. The reaction solution was poured into a mixed solution of methanol (100 ml) and hydrochloric acid (5 ml) so as to effect reprecipitation. By purifying the reaction mixture by Soxhlet extraction (methanol, hexane, and chloroform), the polymer P3 represented by the above formula was obtained as a blue-purple solid (108 mg, 75% yield).

Synthesis of Polymer P3 used in Exemplary Embodiment 2

Polymer P3 used in exemplary embodiment 2 was synthesized in the same way as in the polymer P3 used in exemplary embodiment 1. Raw-material monomers that were used were raw-material monomers A5 and A11, as in the case of exemplary embodiment 1. However, the number average molecular weight of the polymer P3 according to exemplary embodiment 2 is different from that of the polymer P3.

Synthesis of Polymer P3 Used in Comparative Example 4

Polymer P3 used in comparative example 4 was synthesized in the same way as in the polymer P3 used in exemplary embodiment 1. Raw-material monomers that were used were raw-material monomers A5 and A11, as in the case of exemplary embodiment 1. However, the number average molecular weight of the polymer P3 according to comparative example 4 is different from that of the polymer P3.

Synthesis of Polymer P4 used in Exemplary Embodiment 3

Polymer P4 used in exemplary embodiment 3 was synthesized in the same way as in the polymer P3 used in exemplary embodiment 1 except for using a raw-material monomer A12 instead of a raw-material monomer A11.

Synthesis of Polymer P5 used in Exemplary Embodiment 4

Polymer P5 used in exemplary embodiment 4 was synthesized in the same way as in the polymer P3 used in exemplary embodiment 1 except for using a raw-material monomer A14 instead of a raw-material monomer A11.

Synthesis of Polymer P6 used in Exemplary Embodiment 5

Polymer P6 used in exemplary embodiment 5 was synthesized in the same way as in the polymer P3 used in exemplary embodiment 1 except for using a raw-material monomer A15 instead of a raw-material monomer A11.

Synthesis of Polymer P7 Used in Exemplary Embodiment 6

Polymer P7 used in exemplary embodiment 6 was synthesized in the same way as in the polymer P3 used in exemplary embodiment 1 except for using a raw-material monomer A13 instead of a raw-material monomer A5 and using a raw-material monomer A14 instead of a raw-material monomer A11.

Synthesis of Polymer P8 used in Exemplary Embodiment 7

Polymer P8 used in exemplary embodiment 7 was synthesized in the same way as in the polymer P3 used in exemplary embodiment 1 except for using a raw-material monomer A17 instead of a raw-material monomer A5, using a raw-material monomer A16 instead of a raw-material monomer A11, and using toluene instead of chlorobenzene as a solvent.

Synthesis of Polymer P9 used in Exemplary Embodiment 8

Polymer P9 used in exemplary embodiment 8 was synthesized in the same way as in the polymer P8 used in exemplary embodiment 7 except for using a raw-material monomer A18 instead of a raw-material monomer A17.

Jsc (short-circuit current density), Voc (open-circuit voltage), and FF (Fill factor) were measured for each of the respective photoelectric conversion elements according to exemplary embodiments 1 to 8 and comparative examples 1 to 4, and PCE (photoelectric conversion efficiency) was calculated in accordance with the following expression.

$$\text{PCE (\%)} = \text{Jsc}(mA/cm^2) * \text{Voc}(V) * FF$$

Results obtained under an AM 1.5 G condition are shown in Table 1.

TABLE 1

| | P-TYPE SEMICONDUCTOR (DONOR) | | | | | | | | | |
|---|---|---|---|---|---|---|---|---|---|---|
| | POLYMER | NUMBER AVERAGE MOLECULAR WEIGHT | LINEAR ALKYL GROUPS | LIGHT ABSORPTION TERMINAL WAVELENGTH (nm) | HOMO (eV) | HOLE MOBILITY ($cm^2$/Vs) | SOLUBILITY (mg/ml) | PCE (%) | Jsc (mA/$cm^2$) | Voc (V) | FF |
| EXEMPLARY EMBODIMENT 1 | P3 | 20200 | 50% | 660 | 5.2 | $8.8 \times 10^{-5}$ | 15 | 4.1 | 8.1 | 0.8 | 0.63 |
| EXEMPLARY EMBODIMENT 2 | P3 | 32700 | 50% | 660 | 5.2 | $1.3 \times 10^{-4}$ | 12 | 5.1 | 9.5 | 0.83 | 0.65 |
| EXEMPLARY EMBODIMENT 3 | P4 | 20000 | 50% | 660 | 5.2 | $9.4 \times 10^{-5}$ | 12 | 3.8 | 9.1 | 0.85 | 0.49 |
| EXEMPLARY EMBODIMENT 4 | P5 | 35000 | 0% | 660 | 5.2 | $1.7 \times 10^{-4}$ | 31 | 5.5 | 8.8 | 0.91 | 0.68 |
| EXEMPLARY EMBODIMENT 5 | P6 | 22000 | 0% | 660 | 5.2 | $8.5 \times 10^{-5}$ | 13 | 6.4 | 11.7 | 0.88 | 0.62 |
| EXEMPLARY EMBODIMENT 6 | P7 | 16000 | 0% | 660 | 5.2 | $8.1 \times 10^{-5}$ | 21 | 5.9 | 11.4 | 0.89 | 0.58 |
| EXEMPLARY EMBODIMENT 7 | P8 | 48000 | 0% | 726 | 4.9 | $7.9 \times 10^{-5}$ | 23 | 3.7 | 10.5 | 0.65 | 0.55 |
| EXEMPLARY EMBODIMENT 8 | P9 | 29000 | 0% | 728 | 5 | $7.8 \times 10^{-5}$ | 22 | 4.1 | 9.1 | 0.82 | 0.55 |
| COMPARATIVE EXAMPLE 1 | P3HT | 16500 | — | 640 | 4.8 | $3.1 \times 10^{-4}$ | 20 | 3.5 | 9.6 | 0.56 | 0.65 |
| COMPARATIVE EXAMPLE 2 | P1 | 18900 | 100% | 660 | 5 | $6.7 \times 10^{-5}$ | 5 | 2.3 | 7 | 0.6 | 0.53 |
| COMPARATIVE EXAMPLE 3 | P2 | 13700 | 0% | 660 | 5.2 | $6.2 \times 10^{-7}$ | 30 | 1.1 | 3 | 0.77 | 0.49 |
| COMPARATIVE EXAMPLE 4 | P3 | 10000 | 50% | 660 | 5.2 | $6.2 \times 10^{-5}$ | 20 | 3.6 | 6.8 | 0.91 | 0.58 |

It was verified that Voc was higher in all the respective photoelectric conversion elements according to exemplary embodiments 1 through 8 compared to the respective photoelectric conversion elements according to comparative examples 1 and 2. It was verified that Jsc was higher in all the respective photoelectric conversion elements according to exemplary embodiments 1 through 8 compared to the respective photoelectric conversion elements according to comparative examples 2 through 4. It was verified that photoelectric conversion efficiency (PCE) was improved in all the respective photoelectric conversion elements according to exemplary embodiments 1 to 8 compared to the respective photoelectric conversion elements according to comparative examples 1 through 4.

The invention is not limited to the above-mentioned embodiments, and various modifications, such as a design change, may be added thereto on the basis of knowledge of those skilled in the art. It should be understood that any embodiment to which one or more of the modifications are added is also included in the scope of the invention.

DESCRIPTION OF THE REFERENCE NUMERALS

10 photoelectric conversion element, 20 substrate, 30 first electrode, 40 hole transport layer, 50 photoelectric conversion layer, 60 electron transport layer, 70 second electrode

INDUSTRIAL APPLICABILITY

The present invention relates to a polymer having high charge mobility and high solubility and to a photoelectric conversion element that converts light energy into electric energy by means of photoelectric conversion using the polymer.

The invention claimed is:

1. A polymer comprising a repeating unit that includes a five-membered ring including a thiazolothiazole framework and a heteroatom, which is expressed by the following Expression (1),
wherein a number average molecular weight is not less than 15,000 and not more than 48,000 in terms of polystyrene,
wherein hole mobility measured by a SCLC method is $7.5*10^{-5}$ cm$^2$/Vs or more,
wherein solubility with respect to 1 mL of chlorobenzene is 10 mg or more,

[Formula 1]

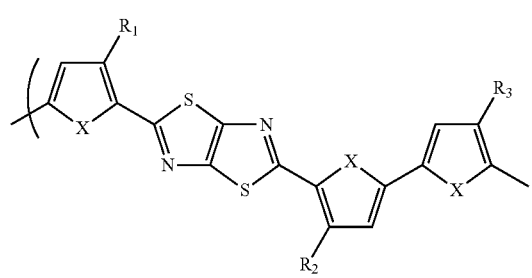

(1)

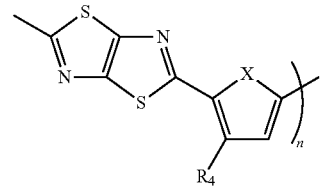

wherein $R_1$, $R_2$, $R_3$, and $R_4$ each independently represent any one of a branched alkyl group, a linear alkyl group, an alkyl ester group, a carboxy alkyl group, and an alkoxy group, wherein a percentage of linear alkyl groups in $R_1$, $R_2$, $R_3$, and $R_4$ does not exceed 50 percent, wherein X is independently any one of S, O, and N, and wherein n is an integer of 1 or more.

2. The polymer according to claim 1, wherein, in Expression (1), $R_1$ and $R_2$ are branched alkyl groups, and $R_3$ and $R_4$ are linear alkyl groups.

3. The polymer according to claim 1, wherein a wavelength of a light absorption terminal of the polymer is 650 nm or more.

4. The polymer according to claim 1, wherein a highest occupied molecular orbital (HOMO) of the polymer is deeper than 5.1 eV.

5. A photoelectric conversion element comprising: a p-type organic semiconductor; a photoelectric conversion layer having the p-type organic semiconductor and an n-type organic semiconductor that forms bulk heterojunction; a first electrode electrically connected to the photoelectric conversion layer on a side of a light-receiving surface of the photoelectric conversion layer; and a second electrode electrically connected to the photoelectric conversion layer on a side of the photoelectric conversion layer opposite to the light-receiving side thereof, wherein the p-type organic semiconductor is a polymer comprising a repeating unit that includes a five-membered ring including a thiazolothiazole framework and a heteroatom, which is expressed by the following Expression (1), a number average molecular weight of the polymer being not less than 15,000 and not more than 48,000 in terms of polystyrene, hole mobility of the polymer measured by a SCLC method being $7.5*10^{-5}$ cm$^2$/Vs or more, solubility of the polymer with respect to 1 mL of chlorobenzene being 10 mg or more,

[Formula 1]
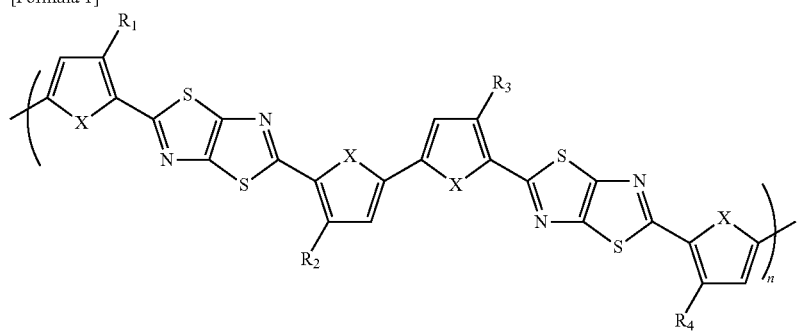
(1)
wherein $R_1$, $R_2$, $R_3$, and $R_4$ each independently represent any one of a branched alkyl group, a linear alkyl group, an alkyl ester group, a carboxy alkyl group, and an alkoxy group,
wherein a percentage of linear alkyl groups in $R_1$, $R_2$, $R_3$, and $R_4$ does not exceed 50 percent,
wherein X is independently any one of S, O, and N, and
wherein n is an integer of 1 or more.
* * * * *